United States Patent
Kumar et al.

(10) Patent No.: US 8,671,329 B2
(45) Date of Patent: Mar. 11, 2014

(54) LOW OVERHEAD AND TIMING IMPROVED ARCHITECTURE FOR PERFORMING ERROR CHECKING AND CORRECTION FOR MEMORIES AND BUSES IN SYSTEM-ON-CHIPS, AND OTHER CIRCUITS, SYSTEMS AND PROCESSES

(71) Applicant: Texas Instruments Incorporated, Dallas, TX (US)

(72) Inventors: Sanjay Kumar, Karnataka (IN); Amit Kumar Dutta, Karnataka (IN); Rubin A. Parekhji, Karnataka (IN); Srivaths Ravi, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/860,773

(22) Filed: Apr. 11, 2013

(65) Prior Publication Data

US 2013/0246889 A1    Sep. 19, 2013

Related U.S. Application Data

(62) Division of application No. 12/774,861, filed on May 6, 2010, now Pat. No. 8,438,344.

(30) Foreign Application Priority Data

Mar. 12, 2010 (IN) .............................. 667/CHE/2010

(51) Int. Cl.
*G11C 29/00* (2006.01)

(52) U.S. Cl.
USPC ...... 714/763; 714/747; 714/746; 365/189.02; 365/201; 365/230.05; 365/189.04; 710/39; 710/52; 711/117

(58) Field of Classification Search
None
See application file for complete search history.

(56) References Cited

U.S. PATENT DOCUMENTS

| | | | | |
|---|---|---|---|---|
| 4,710,934 A | * | 12/1987 | Traynor | 714/765 |
| 5,224,214 A | * | 6/1993 | Rosich | 710/39 |
| 6,718,444 B1 | * | 4/2004 | Hughes | 711/155 |
| 7,903,885 B2 | * | 3/2011 | Tsuruta | 382/232 |
| 2006/0059406 A1 | * | 3/2006 | Micheloni et al. | 714/763 |
| 2006/0123322 A1 | * | 6/2006 | Leung et al. | 714/763 |
| 2009/0187809 A1 | * | 7/2009 | Fekih-Romdhane et al. | 714/763 |
| 2009/0300297 A1 | * | 12/2009 | Ikeuchi et al. | 711/155 |

* cited by examiner

*Primary Examiner* — John Trimmings
(74) *Attorney, Agent, or Firm* — Wade J. Brady, III; Frederick J. Telecky, Jr.

(57) ABSTRACT

An electronic circuit (200) for use with an accessing circuit (110) that supplies a given address and a partial write data portion and also has dummy cycles. The electronic circuit (200) includes a memory circuit (230) accessible at addresses, an address buffer (410), a data buffer (440) coupled to the memory circuit (230), and a control circuit (246) operable in the dummy cycles to read data from the memory circuit (230) to the data buffer (440) from a next address location in the memory circuit (230) and to store that next address in the address buffer (410). The electronic circuit further includes a multiplexer (430), a comparing circuit (420) responsive to the given address and a stored address in the address buffer (410), to operate the multiplexer (430) to pass data from the data buffer (440) or to pass data from the memory circuit (230) instead; and a mixer circuit (450) operable to put the partial write data portion into the data taken from the selected one of the data buffer (440) or memory circuit (230). Other circuits, devices, systems, processes of operation and processes of manufacture are also disclosed.

15 Claims, 14 Drawing Sheets

LOW OVERHEAD AND TIMING IMPROVED ARCHITECTURE FOR PERFORMING ERROR CHECKING AND CORRECTION FOR MEMORIES AND BUSES IN SYSTEM-ON-CHIPS, AND OTHER CIRCUITS, SYSTEMS AND PROCESSES

CROSS-REFERENCES TO RELATED APPLICATIONS

This application is a Division of U.S. patent application Ser. No. 12/774,861, entitled "Low Overhead and Timing Improved Architecture for Performing Error Checking and Correction for Memories and Buses in System-On-Chips, and Other Circuits, Systems and Processes," filed May 6, 2010, which is incorporated herein by reference in its entirety and which claims priority under the Paris Convention and 35 U.S.C. 119 and all other applicable law to India Patent Application 667/CHE/2010 "A Low Overhead and Timing Improved Architecture for Performing Error Checking and Correction for Memories and Buses in System-On-Chips, Systems and Processes," filed Mar. 12, 2010, which is also incorporated herein by reference in its entirety.

STATEMENT REGARDING FEDERALLY SPONSORED RESEARCH OR DEVELOPMENT

Not applicable.

COPYRIGHT NOTIFICATION

Portions of this patent application contain materials that are subject to copyright protection. The copyright owner has no objection to the facsimile reproduction by anyone of the patent document, or the patent disclosure, as it appears in the United States Patent and Trademark Office, but otherwise reserves all copyright rights whatsoever.

BACKGROUND

Permanent failures in a memory due to effects such as aging, and transient failures or soft errors in on-chip memory during application execution due to alpha particle incidence, process marginalities, etc., call for deployment of error detection and correction technologies in system-on-chips (SoCs). Field reliability of memories is a concern for mission critical applications, e.g. storage, automotive, medical, etc. So, online detection and correction of faults in memories are important. Error correction of memory can make the application robust to such marginality fails, as well as radiation induced fails, thereby also extending use life of the affected devices.

Conventional error correction codes can be used to encode the data in the memory; however, they are associated with the following limitations and problems:
(i) Implementations using Error Checking and Correction (ECC) schemes based on Hamming codes are associated with a higher timing overhead, which slows down the operating frequency of the system in which the memory is used. While techniques such as pipelining help in reducing timing overhead at the cost of throughput, the CPU (processor) in many existing SoCs is unaware of the pipeline stages and has to defer any memory transaction until the existing transaction is completely cleared.
(ii) Partial writes (e.g. byte write to a memory of higher data width) and other types of accesses to memory are handled inefficiently with an impact on throughput.

Another type of problem called Problem 2 herein involves crosstalk on long buses. In DSM (deep sub-micron) technologies, the interconnect metal sub-system covering long bus routes causes additional problems such as crosstalk. It is believed that this effect is ignored in conventional testing methods using ATPG (automated test pattern generation) or BIST (built-in self-test) techniques. While bus activity is a composite model involving multiple signals and their transitions, it is believed the conventional techniques only focus on fault models at the gate and cell levels.

It would be desirable to address the above mentioned problems and issues, among others.

SUMMARY OF THE INVENTION

Generally, a form of the invention involves an electronic circuit for use with an accessing circuit that supplies a given address and a partial write data portion and also has dummy cycles. The electronic circuit includes a memory circuit accessible at addresses, an address buffer, a data buffer coupled to the memory circuit, and a control circuit operable in the dummy cycles to read data from the memory circuit to the data buffer from a next address location in the memory circuit and to store that next address in the address buffer. The electronic circuit further includes a multiplexer, a comparing circuit responsive to the given address and a stored address in the address buffer, to operate the multiplexer to pass data from the data buffer or to pass data from the memory circuit instead; and a mixer circuit operable to put the partial write data portion into the data taken from the selected one of the data buffer or memory circuit.

Generally, a process form of the invention for operating an electronic circuit, includes accessing a memory circuit at an address, reading data in the locality of the address during dummy cycles and buffering the data so read, performing a partial write by combining a partial write data portion with data either from a memory read or from the buffered data, and generating parity bits for the partial write based on the combined data.

Generally, another form of the invention involves an electronic circuit including a memory accessible by a memory read, a bus connected to the memory, an accessing circuit coupled to the memory via the bus to obtain data by a memory read, an error correcting code encoder coupled to the bus and the encoder including a write buffer operable to hold write data, an error correcting code decoder coupled to the memory, and a read bypass circuit coupled to obtain the data for the accessing circuit from the write buffer when the write buffer already includes the data that is to be obtained by the memory read.

Generally, another process form of the invention for operating an electronic circuit, includes writing data to a memory, buffering write data substantially in an ECC encoder, and on a memory read, bypassing buffered data from the ECC encoder into a read output instead when the buffered data already includes the data that is to be obtained by the memory read.

Generally, a further form of the invention involves an error correcting code circuit including a readable memory circuit, a parity memory, an error correcting code encoder having a pipelined write to the parity memory, a read-access circuit that is operable to cause a read to the parity memory regardless of whether the read is simultaneous with the actual occurrence of the pipelined write to the parity memory whereby the read-access circuit is pipeline-unaware; and the parity memory is dual-ported so that, on a read caused by the pipeline-unaware read-access circuit, the parity memory is operable to read out parity bits for data that is read from the memory circuit and the encoder is concurrently operable to write other parity bits to the parity memory by the pipelined write.

Generally, an additional form of the invention involves an error correcting code circuit including a bus, a parity generator module coupled to a first-place on the bus and operable to generate ECC parity, a mode-responsive selector circuit fed at a first input by the parity generator and at a second input from a second place on the bus, and an ECC decoder including an error detector selectively fed from the selector circuit.

Generally, a further process form of the invention for operating an integrated circuit memory with a bus coupled to an ECC circuit, involves a process including pipelining operations of an ECC encode with write to a dual-ported parity memory, and read-accessing the dual-ported parity memory for an ECC decode regardless of whether the read is simultaneous with the actual occurrence of the pipelined write to the parity memory.

Generally, a type of system form of the invention involves an automotive electronic system including a microcontroller, a bus coupled at a first place to the microcontroller, a memory coupled to the bus at a second place away from the microcontroller, a control peripheral coupled to the bus, and an error correcting code (ECC) circuit, and the ECC circuit includes a parity generator ECC module coupled to substantially the first place and operable to generate parity, a mode-responsive selector circuit fed at a first input by the parity generator and at a second input from substantially the second place on the bus, and an ECC decoder including an error detector fed from the bus and from the selector circuit.

Generally, another system form of the invention involves a computer processing system including a microprocessor, a bus coupled to the microcontroller, a memory coupled to the bus, a data sensor peripheral coupled to the bus, a modem, and an ECC encoder for use with an accessing circuit having dummy cycles and selected from the group consisting of 1) the microprocessor, 2) the data sensor peripheral, 3) the modem. The accessing circuit is operable to supply a partial-write address and a partial write data portion. The encoder is operable to access the memory at an address, and to read data in the locality of the address during dummy cycles and buffer the data so read, and to perform a partial write by combining the partial write data portion with data either from a memory read or from the buffered data, and to generate parity bits for the partial write based on the combined data.

Generally, a still further process form of the invention involves a manufacturing process that includes fabricating an integrated circuit memory with a bus coupled to an ECC circuit, disabling the ECC circuit, writing data and parity into the memory on respective pluralities of lines of the bus, enabling the ECC circuit, reading data and parity from the memory, operating the ECC circuit to detect error in the data read from the memory using the parity, operating the ECC circuit to independently generate parity for the data during the reading of the data from the memory and comparing the generated parity with the parity that is read from the memory, and updating an error report with the results of the comparing.

Other circuits, devices, systems, processes of operation and processes of manufacture are also disclosed and claimed.

BRIEF DESCRIPTION OF THE DRAWINGS

FIG. 10A is a block diagram for an alternative inventive multiplexing circuit in the error correcting code decoder of FIG. 10.

Corresponding numerals or letter symbols in different Figures indicate corresponding parts except where the context indicates otherwise.

DETAILED DESCRIPTION

Figure 1:
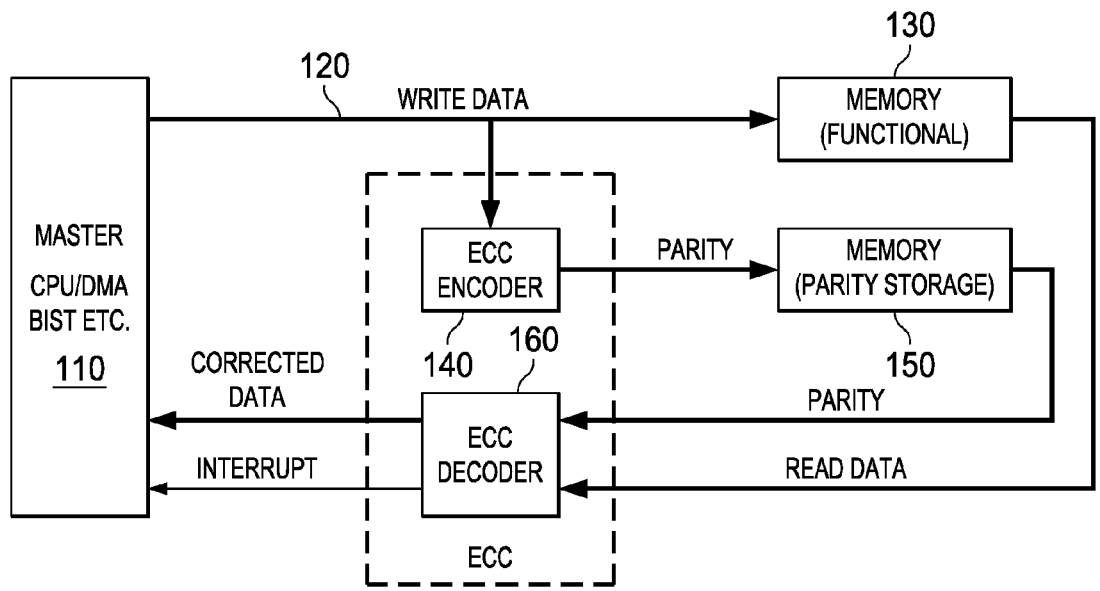
FIG. 1 is a block diagram of a computing system that has an error correcting code (ECC) circuit.

To solve these problems and others, a high performance ECC embodiment is realized through remarkable controller structures and operations and provision of local buffering in the encoder/decoder. The embodiments provide throughput improvement for partial writes exploiting locality in data traffic, and also provide throughput improvement for pipelined ECC with pipeline-unaware CPUs. Some embodiments take advantage of the locality characteristic of data traffic in applications to significantly reduce cycle overhead of partial word operations, which in-turn increases the throughput. Some read embodiments enhance throughput by read bypass from a local write buffer to read output and also take advantage of locality in data traffic. Further, some of the embodiments provide an architecture that uses Hsiao codes to realize low area and low timing overhead encoders and decoders individually and in combinations.

Test process embodiments are disclosed for using the structural embodiments during manufacturing-time test of SoCs. To solve testing issues, an ECC embodiment is not only used for memory but also extended to a bus. A parity generator based on Hsiao code is placed at the source logic which drives the bus. Then a Hsiao code based ECC decoder is placed on the end part of the bus. The parity is sent in parallel to the decoder. The decoder checks for any errors which occur on the bus during data transmission due to issues like crosstalk, power supply droop, etc., that can also be corrected. In this case, no extra parity check bits, as for memories, are involved so that ECC for buses herein is low cost. Many debug features are provided for silicon test. Periodic off-line testing and -line testing are facilitated. Error logging capability is provided to give information about error locations, failing locations and types of failures.

Some benefits and advantages of the embodiments include: Low timing overhead of embodiments allows wide deployment of ECC technology in high-performance integrated circuit chips. Transparent encoding and decoding speeds for GHz designs are made achievable in 90 nm and 65 nm, for two example process nodes among others. Performance is believed to be about 25% faster than Hamming code based implementation.

High throughput is achieved as described herein. Some embodiments are believed to provide up to 60% throughput improvement or more in various application use-case scenarios due to remarkable handling of partial writes. The comparison is with respect to two cases. First case is where partial write takes two (2) cycles because ECC has to get the full data to calculate parity, so it has to do a read before partial write. A second case is where read takes 2 cycles due to timing pipeline on ECC decoder side and the CPU is not aware of this 2 cycles pipeline delay. Low area overhead architecture has a silicon footprint area overhead of 4K NAND2 (two-input) gate equivalents for representative memory of 32-bit wordlength. Conventional ECC solutions have taken more than 6K.

A Bypass mechanism operates so that any time during test or normal operation ECC can be either enabled or bypassed.

Access from both test and CPU provides ECC control and access registers for debug features from both test mode controller and system CPU. Interrupts are generated after occurrence of any specified number of errors or uncorrectable error.

Because one type of embodiment for memory ECC needs no parity memory, it is also usable as a low cost solution for bus ECC.

Some topics discussed and described herein include:
Problems solved by embodiments
Need for error correction in memory
High overheads of conventional ECC schemes
Solutions to problems
Hsiao code Ecc saves chip real estate with small XOR trees.
Type-1 ECC architecture with parity memory
Type-2 ECC architecture without parity memory
Partial write buffering
Dual ported parity memory
Read bypass of memory using write buffers on some reads
Read bypass of ECC error generator when syndrome indicates no error
Advantages and benefits(comparisons with other solutions)
Hsiao code based ECC basics Reasons that error correction in memory is important include permanent failures in memory due to aging and other phenomena, and transient failures or soft errors in on-chip memory during application execution due to effects such as alpha particle incidence, heat, process marginalities, etc. These failures and effects motivate error correction improvements for use during manufacturing test and built-in self-test (BIST) in the field. Error correcting codes (ECC) can address both these problems. Not only transient failures but also some permanent failures are correctable using ECC. ECC technology reduces dependency on other techniques such as redundant row/column based repair solutions.

FIG. 1 shows a basic ECC architecture. A bus master 110, such as processor CPU, direct memory access (DMA), BIST, etc., sends read/write addresses and controls and write data via a bus 120 to access a memory 130. Memory 130 is a functional memory that can enter write data or can return read data in response to an access. Problematic high overheads and limitations are associated with conventional ECC based implementations. ECC based on Hamming codes can have higher timing overheads that slow down the maximum useful system frequency. Pipelining might reduce timing overheads but at the cost of throughput. An ECC encoder 140 is coupled for input from bus 120 and generates parity to a parity storage memory 150. Read data from memory 130 and parity from parity storage memory 150 are coupled to an ECC decoder 160 which in turn provides corrected data to the bus master 110. If one or more errors are uncorrectable, an interrupt is supplied to the CPU. In an existing SoC, if ECC is used at all, the CPU is unaware of whether an ECC encode and/or decode pipeline is present and, if present, will have to defer a memory transaction until the existing or current transaction is completely cleared, see discussion of FIG. 21. Partial writes to memory present problems in FIG. 1, see discussion of FIG. 22. Partial writes to memory and some other accesses can be handled much more efficiently as taught with other Figures herein and can deliver a beneficial impact on throughput. Advantage can be taken of the locality that is characteristic of data traffic in applications as taught herein.

Two main categories for ECC embodiments herein are called Type-1 and Type-2 architectures. Some embodiments include architecture that uses Hsiao codes as opposed to conventional Hamming codes. For some Hsiao code background see for instance "A Class Of Optimal Minimum Odd-Weight-Column SEC-DED Codes", by M. Y. Hsiao, IBM Journal of Research and Dev., Vol. 14, Issue 4, July, 1970, pp. 395-401; and C. L. Chen and M. Y. Hsiao, Error-correcting codes for semiconductor memory applications: a state-of-the-art review, IBM J. Res.& Devel., March 1984, vol. 28, no. 2, pp. 124-134. For some Hamming code background see for instance R. W. Hamming, (1950), Error Detecting and Error Correcting Codes, *Bell System Tech. J.*, 29: 147-160.

Figure 2:
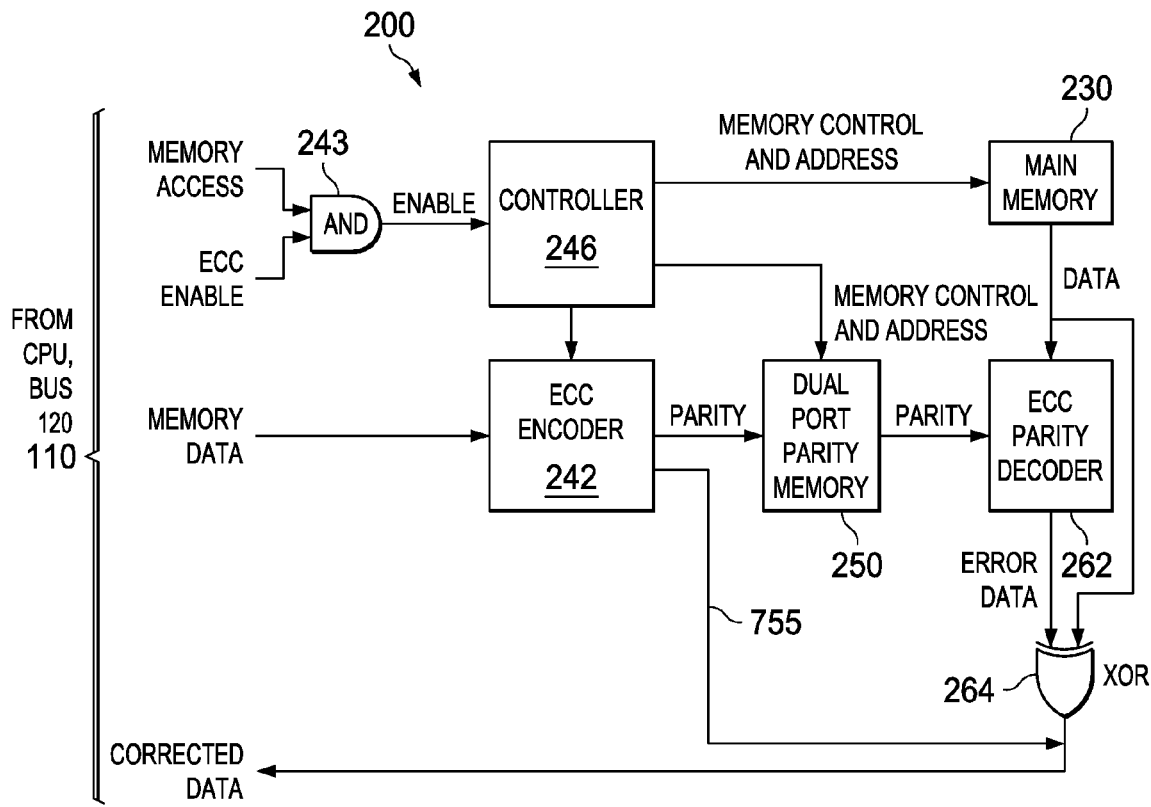
FIG. 2 is a block diagram of an inventive error correcting code circuit.

In FIG. 2 and other Figures, low overhead encoder and decoder embodiments are provided. Advantages of using Hsiao over Hamming code is lower number or level of logic gates in encoder/decoder. Hsiao code guarantees SECDED (single error detection and double errors detection) operations, yet unlike Hamming code, it has acceptably-less probability of correcting more than one bit error among parallel bits on a bus. Controller modifications and local buffer usage are provided for realizing high performance. Throughput improvement for partial writes exploits locality in data traffic. Throughput improvement for pipelined ECC embodiments is applied with pipeline-unaware CPUs. A CPU embodiment with hardware ECC architecture needs no parity memory.

In FIG. 2, an architecture embodiment for some Type-1 ECC embodiments is illustrated. A main memory 230 is coupled by a bus (not shown, for clarity) to a processor CPU off-left of the drawing, and a detail of ECC blocks is shown. Use of the phrase "main memory" should be understood as a convenient label and not by of limitation, since various embodiments are applicable to cache, SRAM DRAM, ROM, Flash memory, magnetic disk, etc. Some embodiments are also applicable for detecting and correcting errors in the bus itself. An improved ECC encoder 242 for partial write and full write is coupled with an improved controller 246. An AND-gate 243 supplies an enable signal to controller 246 when the CPU sends both an active memory access signal and an active ECC enable signal. The controller 246 has a state machine 300 as detailed in FIG. 3 and provides controls to the ECC encoder 242 as well as memory read/write control and address signals to both main memory 230 and to a special dual ported parity memory 250. The parity memory 250 is dual-ported as discussed for FIG. 9. Bus data for memory 230 from the processor is input (Memory data) to the ECC encoder 242, which in turn supplies parity bits to the dual ported parity memory 250 and those parity bits pertain to write data on a data write to the main memory 230.

On read, data from a read address in the main memory 230 is read out in response to memory read control and read address signals from the controller 246. Concurrently, the dual-ported parity memory 250 responds to controller 246 and reads out parity from that read address. That parity is the parity pertaining to data that was earlier-written to main memory 230 at that read address. The read data that is read out from main memory 230 should be the same as the write data from which the parity was encoded, but a data error may have occurred. An ECC parity decoder 262 processes the data read from main memory 230 as well as the parity bits retrieved from the parity memory 250. ECC parity decoder 262 provides error data to an XOR block 264 that corrects the data from main memory 230 and supplies the corrected data to the accessing circuits such as DMA, processor, or other system module.

Figure 3:
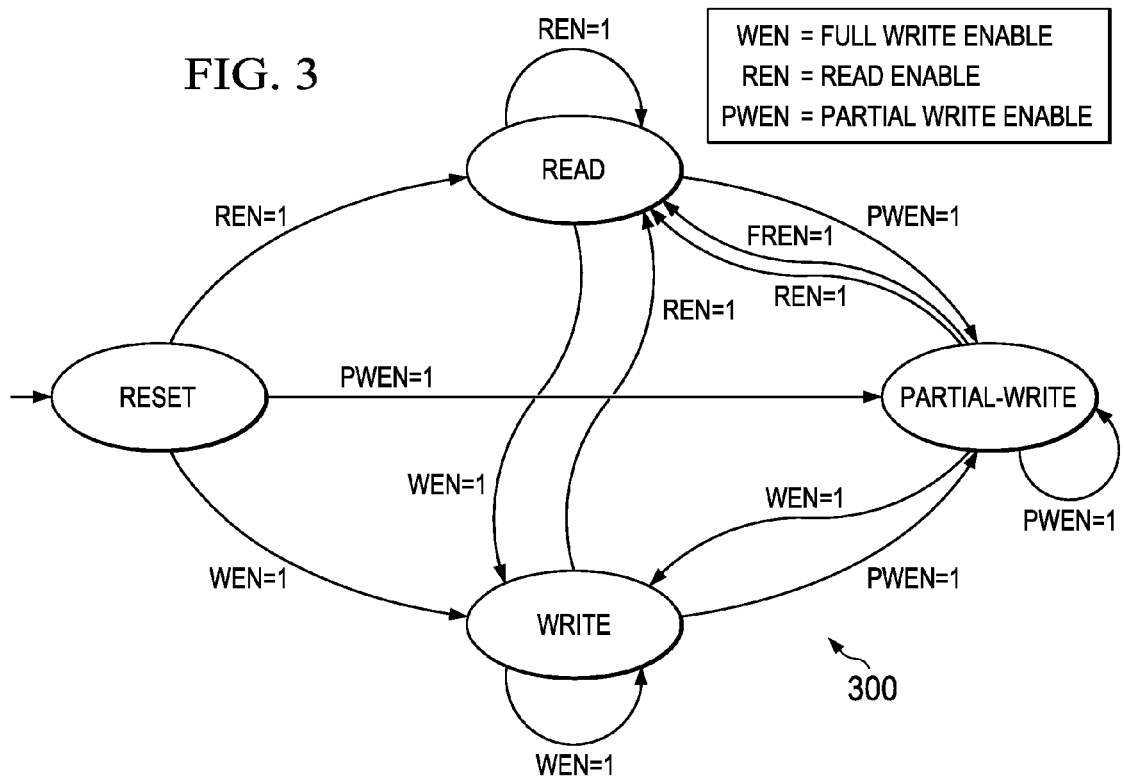
FIG. 3 is a state transition diagram for a state machine for use in a controller of FIG. 2.

FIG. 3 depicts a state transition diagram for an ECC controller state machine embodiment 300 for use in FIG. 2. This state machine has states for Reset, Read, Write, and Partial-write. Depending on the current state of the state machine, particular transitions to another state are actuated by the following control signals from or derived from the processor: WEN=Full write enable, REN=Read enable, PWEN=Partial write enable, FREN=Forced Read Enable after Partial write request. The states of the state machine 300 provide output controls to the main memory 230 and to the parity memory 250 to make operations happen as discussed for FIGS. 2, 4, 10 and other Figures herein. Some embodiments include one or more logic structures and/or further state machines to effectuate operations initiated by the respective Read, Write and Partial Write states of state machine 300.

Figure 4:
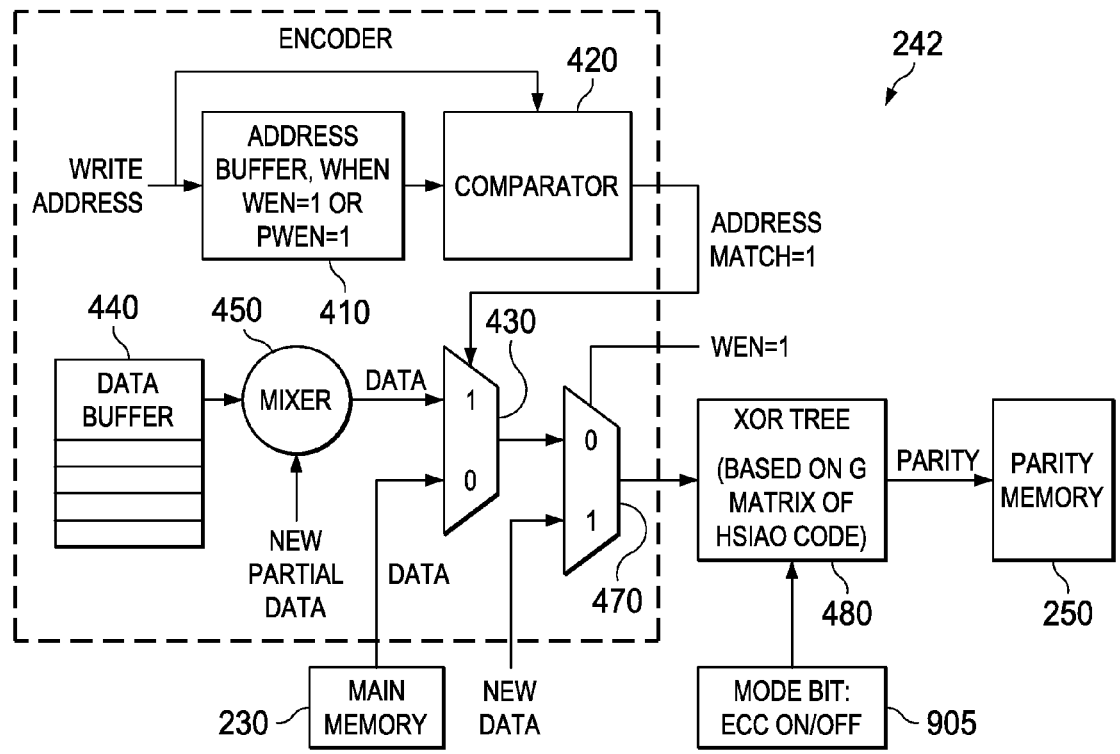
FIG. 4 is a block diagram of an inventive error correcting code encoder including inventive circuitry for partial write and for full write in an inventive ECC circuit (Type-1)
Figure 19:
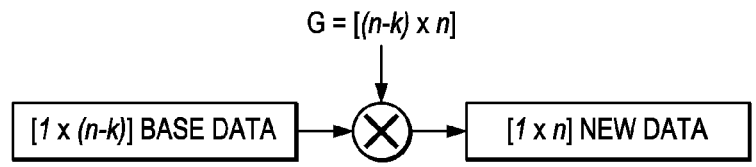
FIG. 19 is a flow diagram for an example of ECC encoding in FIGS. 2, 4, 8, 16 and 23/23A.

In FIG. 4, an example of an embodiment of the ECC encoder 242 of FIG. 2 has these components. An address buffer 410 stores the write address sent from bus master such as CPU to main memory 230. The address is stored in buffer 410 when Full-write or Partial-write enable is detected by the ECC controller 246. A Comparator 420 checks the difference between the current partial write address sent by the CPU and the stored address in the address buffer 410. If the difference is 0, then it sets an "address match" signal to '1'. If this signal is set to '1', the Parity encoder 242 has a Data MUX 430 with its selector input fed by the Address Match signal to take (mux-select) data from a write Data buffer 440, else the Data MUX 430 takes data from Memory 230 and uses such data for partial write as well. Such memory data is also put in the Data buffer 440 (See also FIG. 23.) The partial write operation and a mixer 450 circuitry of FIGS. 4, 5 and 23 inserts a New Partial Data write portion or byte from the processor CPU into the wider data taken from the selected one of Data buffer 440 or memory 230. The circuitry 460 surrounded by the dotted line facilitates throughput improvement in the partial write path. A second MUX 470 is actuated by WEN=1 on full write to pass New Data from CPU as the data for ECC encoding by an XOR tree 480 (FIG. 19). Otherwise on WEN=0 and PWEN=1, New Partial Data is mixed (see also FIG. 23) with the data taken from the selected one of Data buffer 440 or memory 230 by Data MUX 430 and sent via the second MUX 470 to the XOR tree 480. XOR tree 480 generates parity by a matrix multiplication whereupon the parity goes to parity memory 250.

In FIG. 4, the encoder components include the XOR tree 480 that is the actual parity encoder for the incoming data to main memory. The structure of this XOR tree 480 results from the generator Matrix (G) of FIG. 19 for the error correction code chosen. The Hsiao code is an example of a beneficial code, and the XOR tree 480 employs the Hsiao code, for example. A description of use of Hsiao code G matrix is given in FIG. 19 and operation using the related Hsiao H matrix is discussed in FIG. 20. The parity output of the XOR tree 480 is written to the parity memory 250.

Figure 5:
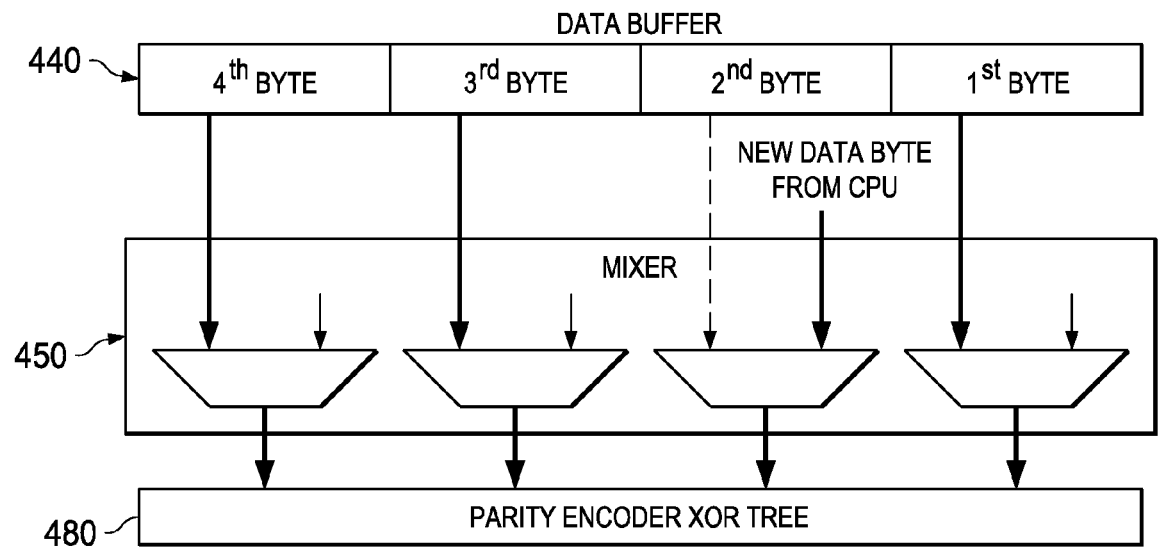
FIG. 5 is a block diagram of an inventive error correcting code circuit including a mixer circuit for FIG. 4, see also FIG. 23/23A.

Data Buffer and Mixer: Data buffer 440 in FIG. 4 stores the Data from main memory 230 that is obtained from an internal read by the ECC controller 246 from main memory 230. When data from Data buffer 440 goes to the parity encoder XOR block 480, not all an entire data length in the data buffer 440 will reach the parity encoder XOR block 480 on a partial write. In FIG. 5, whichever part of the data is due for partial access is inserted or replaced by the new data from CPU by the Mixer 450. The rest of the data occupying the data length is same as the data provided from the Data buffer 440 (or memory 230 if selected).

In FIG. 5, a Mixer 450 structure for Partial Write shows a Data path from the data buffer 440 of FIG. 4 to parity encoder XOR block 480. Each bold down-arrow indicates an active byte-wide data path. In this FIG. 5 example, assume that 4 bytes are the total data length. Suppose that a 2nd byte is supposed to be modified into memory 230 due to partial access. In this case, the 1st, 3rd, and 4th byte come from Data buffer 440. Only the 2nd byte comes from the new data sent from CPU and destined for memory 230 during partial write access.

Figure 6:
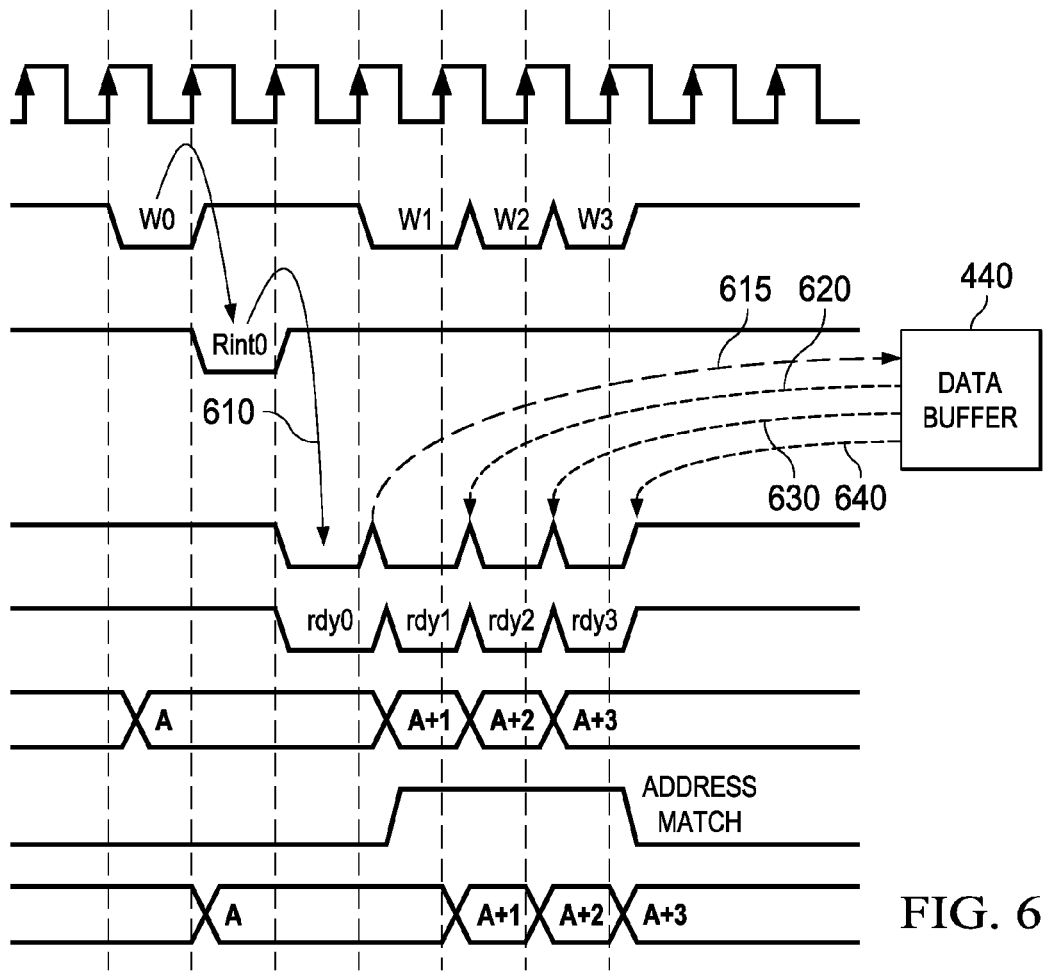
FIG. 6 is a waveform diagram versus time and showing waveforms in an inventive process of operation in FIGS. 4 and 23/23A such as for partial writes involving the data buffer therein.

In FIG. 6, a Timing diagram shows throughput improvement in partial write in FIG. 4. Here, four (4) consecutive addressed partial writes take six (6) cycles illustrated from left to right. The first partial write 610 occupies a first three (3) cycles (R0, Rint0, Wr), and includes the memory 230 access Rint0 that is stored into data buffer 440. The other three partial write accesses take one cycle each over a subsequent three (3) cycles. The first three (3) cycles are so many due to internal read to memory 230 for data. Once data is available in the Data Buffer 440, there is no need for additional internal read to memory 230, and writes are consecutively made out of the data buffer 440 via mixer 450 in one cycle each.

In the FIG. 6 waveform diagram see the following waveforms in order from top to bottom:
Clock
Request from CPU R0-R3
Internal read request Rint0 from ECC to memory 230 for read into mux 430 and data buffer 440,
leads to (next-below):
Subsequent waveform of Internal write request from ECC controller 246 to memory 230.
Ready from ECC controller 246 to CPU rdy0-3 (acknowledgement)
Address A from CPU
Address Match signal from comparator 420
Buffered Address A of address buffer 410 is delayed by one cycle compared to address A from CPU.

Suppose CPU issues a partial write to the memory 230. The address A is stored into Address buffer 410. The ECC controller 246 will issue an internal read Rint0 to the memory 230. So the first write ends up consuming two (2) extra cycles for the system. The cycles encompass internal read from ECC to memory 230 and then write to the memory 230, like Read-modified-Write. A problem happens when partial address is pointing to a different physical location in the memory 230 even if the address is consecutive compared to last address. For example, take a 4 bytes (32 bits) data width memory. Assume CPU is doing byte access. In TABLE 1, ADD3 and ADD4 are physically different in memory. Even if these two addresses are consecutive, there will be an extra read operation for ADD4, and for any general address ADDI+4. This problem is solved as explained herein.

TABLE 1

| BYTE ADDRESSING | | | |
|---|---|---|---|
| Byte3 | Byte2 | Byte1 | Byte0 |
| ADD3 | ADD2 | ADD1 | ADD0 |
| ADD7 | ADD6 | ADD5 | ADD4 |
| ... | ... | ... | ... |
| ADDI+3 | ADDI+2 | ADDI+1 | ADDI |
| ADDI+7 | ADDI+6 | ADDI+5 | ADDI+4 |

Figure 7:
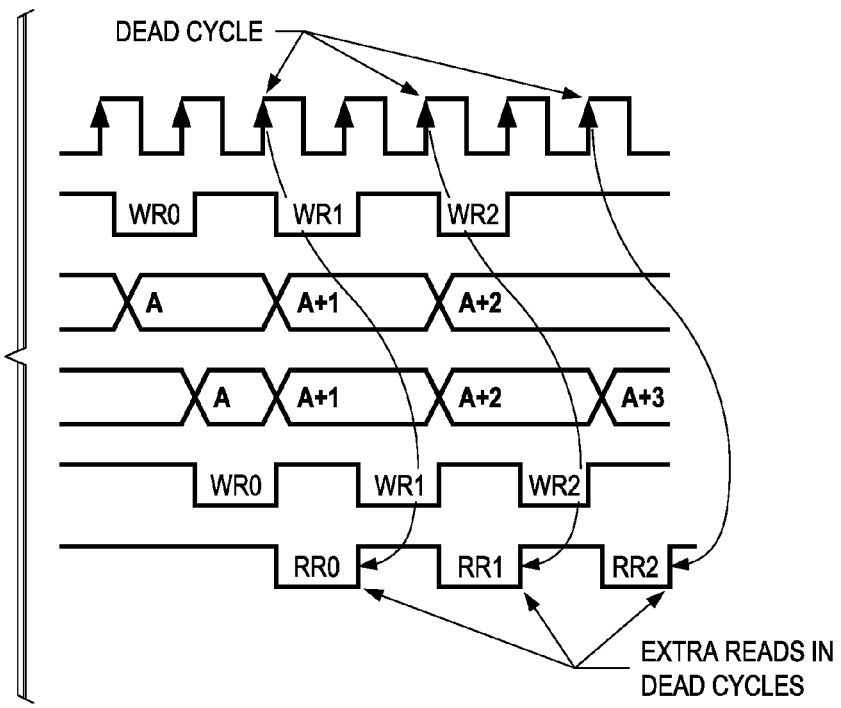
FIG. 7 is a waveform diagram versus time and showing waveforms in an inventive process of operation in FIGS. 4 and 23/23A such as performing extra (speculative) reads from memory into the data buffer during dead cycles or dummy cycles.

In FIG. 7, Note the Extra reads are advanced speculatively or anticipatorily into dead cycles where the waveforms shown are:
Clock
Write req from CPU
Address from CPU
Address from ECC to memory
Write req. from ECC to memory
Read req. from ECC to memory By contrast, a partial-write buffering embodiment in FIGS. 4-9 solves the problem and improves the throughput for partial writes in FIG. 4 even further. The additional and separate data buffer 440 is provided for data storage. Apart from issuing a read access to a requested address in memory 230 for partial write, the ECC Controller 246 in FIG. 2 issues a read operation to the memory 230 to the next address location with respect to the last partial write address, i.e. in its locality. This is done, for instance, when ECC controller 246 finds no access request from CPU, meaning a dummy cycle is elapsing. The CPU inserts these dummy cycles due to various reasons like interrupt activations, pipeline latency, holding next instruction due to resource conflict etc. These dummy cycles are used to advantage by ECC Controller 246 to set FREN=1 and cause a transition to READ state in FIG. 3 and fill up the internal write Address buffer 410 and correspondingly fill up write Data buffer 440. See also FIG. 23.

Consider a 32 bit data memory with [byte 3, byte 2, byte 1, byte 0] at a memory address 0 and another [byte 3, byte 2, byte 1, byte 0] at a memory address 1 consecutive to memory address 0. If an partial write access is issued for any of the bytes of memory address 0, then apart from issuing a read operation to memory address 0, the ECC controller also issues read access to memory address 1 if and when a dummy CPU cycle is available. So when the partial write crosses to memory address 1 after memory address 0, no need arises to issue a read access to memory address 1 as the data is already available. Of course, this is in anticipation of partial writes consecutively going on for some long time, which in practical applications has a high probability.

Figure 7A:
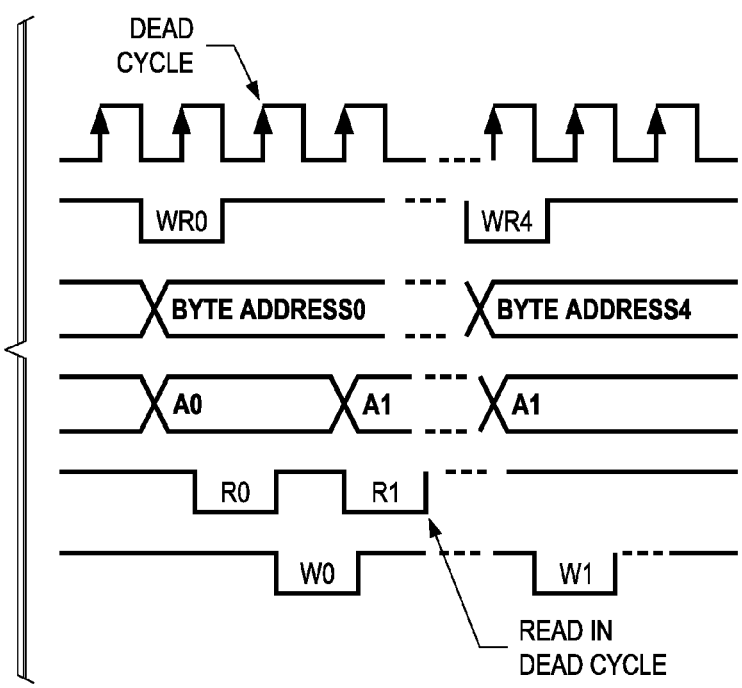
FIG. 7A is another waveform diagram versus time and showing waveforms in an inventive process of operation in FIGS. 4 and 23/23A such as performing an extra (speculative) read from memory into the data buffer during a dead cycle or dummy cycle.

In FIG. 7A a timing diagram of the above scenario involves a beneficial dummy cycle read R1 followed by benefited partial write WR4, W1. FIG. 7A supplements the timing diagram of FIG. 7. In FIG. 7A, WR0 signifies a partial write request involving location byte 0 in the word at memory address 0 (i.e., A0 in FIG. 7A). That word at address A0 is accessed by a word read R0 and mixing in FIG. 5 of write byte 0 with that word read, followed by a write access W0 to execute the partial write to address A0. Using the remarkable process herein, an extra read access R1 is executed to consecutive memory address 1 (i.e., at address A1=A0+1) as soon as a dead cycle is available. Suppose a partial write WR4 later occurs to some byte, e.g. byte 0, of memory address 1. Beneficially, no read access in connection with that partial write WR4 is issued to memory address 1 because the earlier read request R1 was already issued by ECC controller in the "Dead cycle." Instead of a new memory read, data buffer 440 immediately provides that already-read word, mixes as in FIG. 5 and executes write W1 in FIG. 7A in the clock cycle next after the partial write request WR4.

In an embodiment wherein each memory write is buffered in the address buffer 410 and data buffer 440 of the ECC encoder, the limited size of the buffers nevertheless means that some much-earlier write data will no longer be present, and accordingly the anticipatory or speculative read in the locality of a latest partial write is beneficially performed. Some embodiments include a circuit to inhibit an anticipatory or speculative read to an address that is already in address buffer 410 and for which data buffer 440 correspondingly has the data. Also, some of these embodiments have the buffer entry and/or pointer indicate how recently the address was accessed in the sense of its depth in the buffer or low priority for an upcoming overwrite, and the inhibit is permitted in that case.

Comparing FIG. 3 and FIG. 7A, the occurrence of a Dead Cycle is represented by a logic state of one or more signals from the processor that depend on its particular architecture. Suitable logic in controller 246 of FIG. 2 responds to such logic state and activates the transition FREN=1 (Forced Read Enable after Partial Write) in FIG. 3 to execute a read access such as R1 above.

Figure 8:
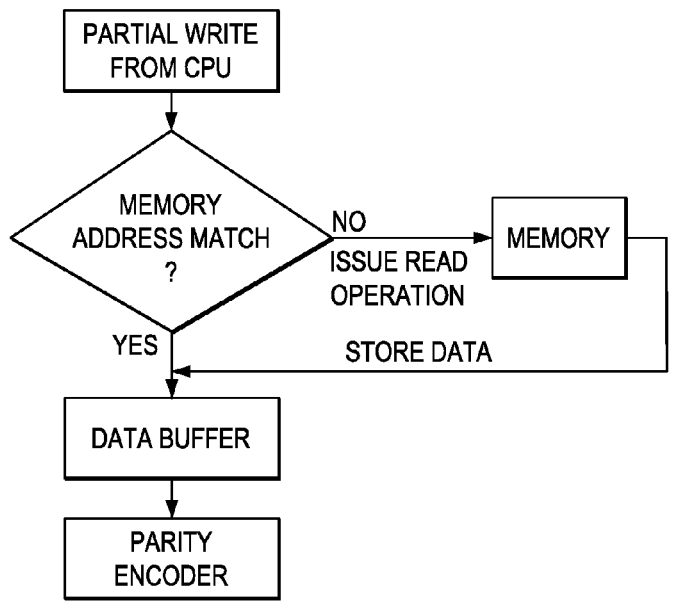
FIG. 8 is a flow diagram of an inventive process of operation in FIGS. 4 and 23/23A such as for a partial write.

In FIGS. 8 and 6, a flow diagram depicts throughput improvement in partial write. When a partial access is performed for the first time (address match=0, "No"), the ECC circuitry of FIG. 4 issues a read operation Rint0 of FIG. 6 to the main memory 230 in the next cycle that includes the word at the consecutive address and thereby encompasses ADDI+4. It stores the data in the Data Buffer 440 of FIG. 4. In the next consecutive cycle, even if partial access is requested from CPU for matching word address (Yes), the ECC Controller circuitry 246 now need not and does not issue any further read operation to memory 230 also as shown in FIG. 6. The information for that consecutive address comes from the write Data Buffer 440 of FIG. 4, 6, 8 or 23. This reduces the number of read operations issued by ECC controller 246 to main memory 230 for every partial write access by CPU not only at a given word address but also the next word address as in TABLE 1.

Buffers 440 and 410 are respectively used for storing a copy of data and its address in below two scenarios, for example:
1. If there is partial write, full word data to calculate the parity is obtained by reading a full word from memory 230. The same data is stored in the buffer 440 so that if the next partial write comes, the full word does not need to be read again from memory 230. The full word data is constructed by mixing data as in FIG. 5 from the buffer 440 and incoming data from CPU 110.
2. Dummy read is initiated when CPU 110 is not accessing the memory. Read address is the next word address (A+1) with respect to the word address A involved in the last partial write. This process in FIG. 7A is called the look-ahead approach herein. This look-ahead approach confers throughput improvement for partial write, as full word data is already stored in buffer 440 and ready for mixing in mixer 450 immediately on a subsequent partial write.

Different scenarios are covered by operation of FIG. 4 comparator 420 due to the condition "Address Match=1." For example, in a Scenario 1, two bytes are adjacent or non-adjacent (assuming CPU generates only byte addresses) in one word address that has, e.g. four bytes 3-0. In a Scenario 2, two such bytes spill over to adjacent addresses. In a Scenario 3, two such bytes spill over to non-adjacent addresses. These addresses are word addresses generated by the memory controller circuit in block 246, as distinguished from byte addresses generated by the CPU 110. All these scenarios are covered in the sense that the circuitry of FIGS. 4 and 23 responds in a time-efficient manner.

The benefit of not having dead/dummy read cycles during a partial write accrue when the two bytes fall in same memory word (Scenario 1). The benefit of also having at least one dead/dummy cycle extends to writes in adjacent words (Scenario 2) if the CPU is idle (has a dummy cycle) for at least one cycle, in which case the read request to the next memory address (with respect to the current partial write address) is issued by the ECC controller 246 and the read data is stored in the data buffer 440.

Figure 23:
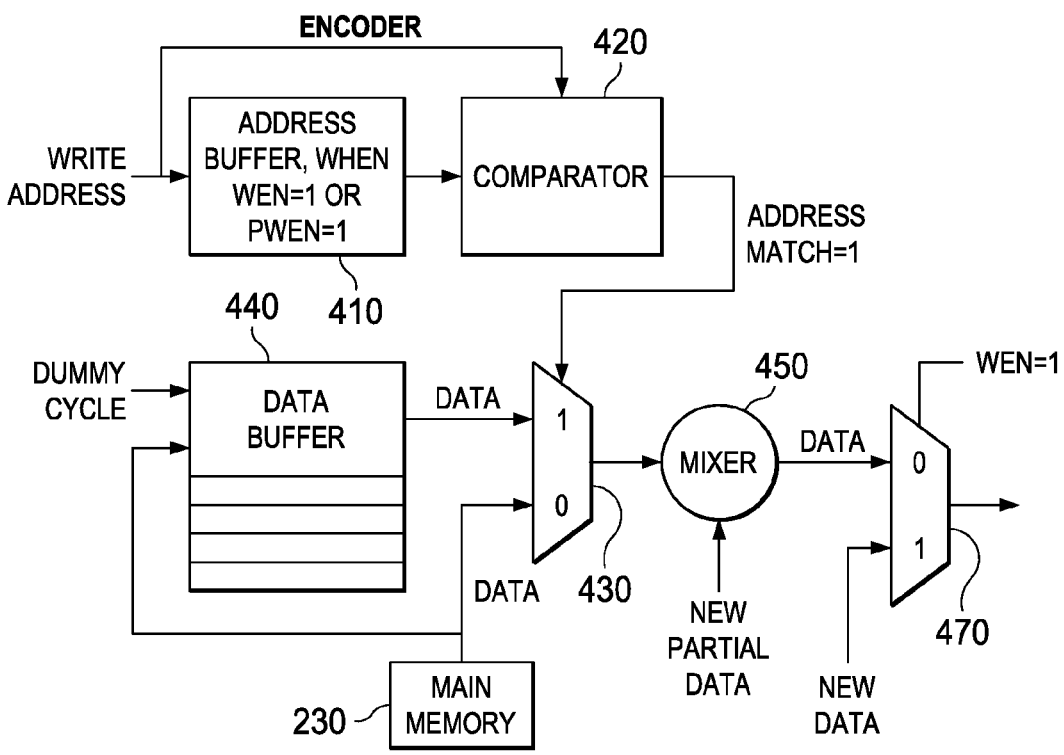
FIG. 23 is a block diagram of an inventive alternative form of error correcting code encoder including inventive circuitry for partial write and for full write in the inventive ECC circuits of FIG. 2 and FIG. 4.

Note that the logic for address buffer 410 of FIGS. 4 and 23 involves address buffering that happens not only when PWEN=1 but also when WEN=1. When WEN=1, address buffer 410 stores data in buffer even in case of full word write.

This WEN=1 buffering benefits pipeline parity encoded circuitry and/or pipeline parity decoder circuitry, for instance. When CPU 110 requests a sequence of accesses having consecutive writes followed by a read operation, then because of pipelined architecture, parity data is not yet written in parity memory 250 for use in error correction. To handle this, data on full write is also stored in buffer 440 for ready access on a soon-subsequent such read.

The circuitry operates to handle each of three cases involve read data from the memory 230 written into data buffer 440. Case (i): Full write data to memory 230 is also written into the data buffer 440. Case (ii): The read data from the memory 230 in case of a read request from the ECC/memory controller 246 associated with partial write is also written into the data buffer 440. Case (iii): In case of no memory 230 access from the CPU 110, when ECC/memory controller 246 issues a dummy-cycle read request to the next address (next with respect to the last partial write address) in the memory 230, the read data is written into the data buffer 440.

Figure 9:
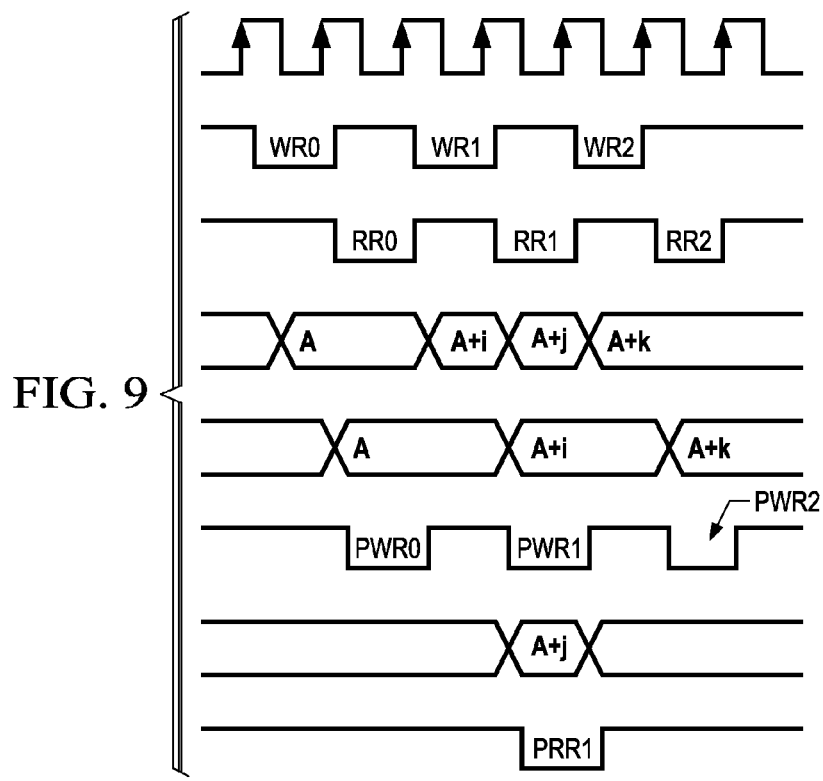
FIG. 9 is a waveform diagram versus time and showing waveforms in an inventive process of operation in FIG. 10 for dual-port parity memory read and read bypass.

In FIG. 9 and turning to another write access timing problem solved herein, system-on-chip SoC architecture involves memory accesses by multiple modules like CPU, DMA, external host etc. to a given memory 230. Thus, the memory 230 input signals are muxed. The muxed data signals go through ECC codec 242 that generates the parity. So the parity generation becomes a huge bottleneck of timing critical signals that are resolved as taught herein.

An embodiment for timing improvement in write access herein pipelines the parity generation so that the operation of write to parity memory 250 is pipelined. With the parity memory write part or operation solved by pipelining, however, then attention here is also given to the subject of a read access requested from CPU in a consecutive cycle(s). This is because read access can probably not be pipelined if CPU is not aware of pipeline in parity, and if read access is not pipelined, then a read request to the parity memory 250 is sent at the same cycle of the CPU read cycle. See discussion of FIGS. 21 and 22. In that case, the parity memory 250 would face read and write accesses at the same time. This is explained and solved next.

In FIG. 9, a timing improvement embodiment for write access solves the above problem. The parity memory for this ECC scheme is provided as dual port memory 250 of FIG. 2 that supports read and write access at the same time (and outputs the older content for the read access if read and write occur at the same location at the same time). Suppose the CPU makes a write request and read request in consecutive cycles to the same location in the dual port memory 250. In this case, if the read address matches with any previous addresses stored in write address buffer 440 of FIGS. 4 and 10, as explained in the FIG. 10-13 decoder description herein, then the read data for FIG. 10 comes from the write data buffer 440 of FIG. 4, instead of from main memory 230.

Figure 10:
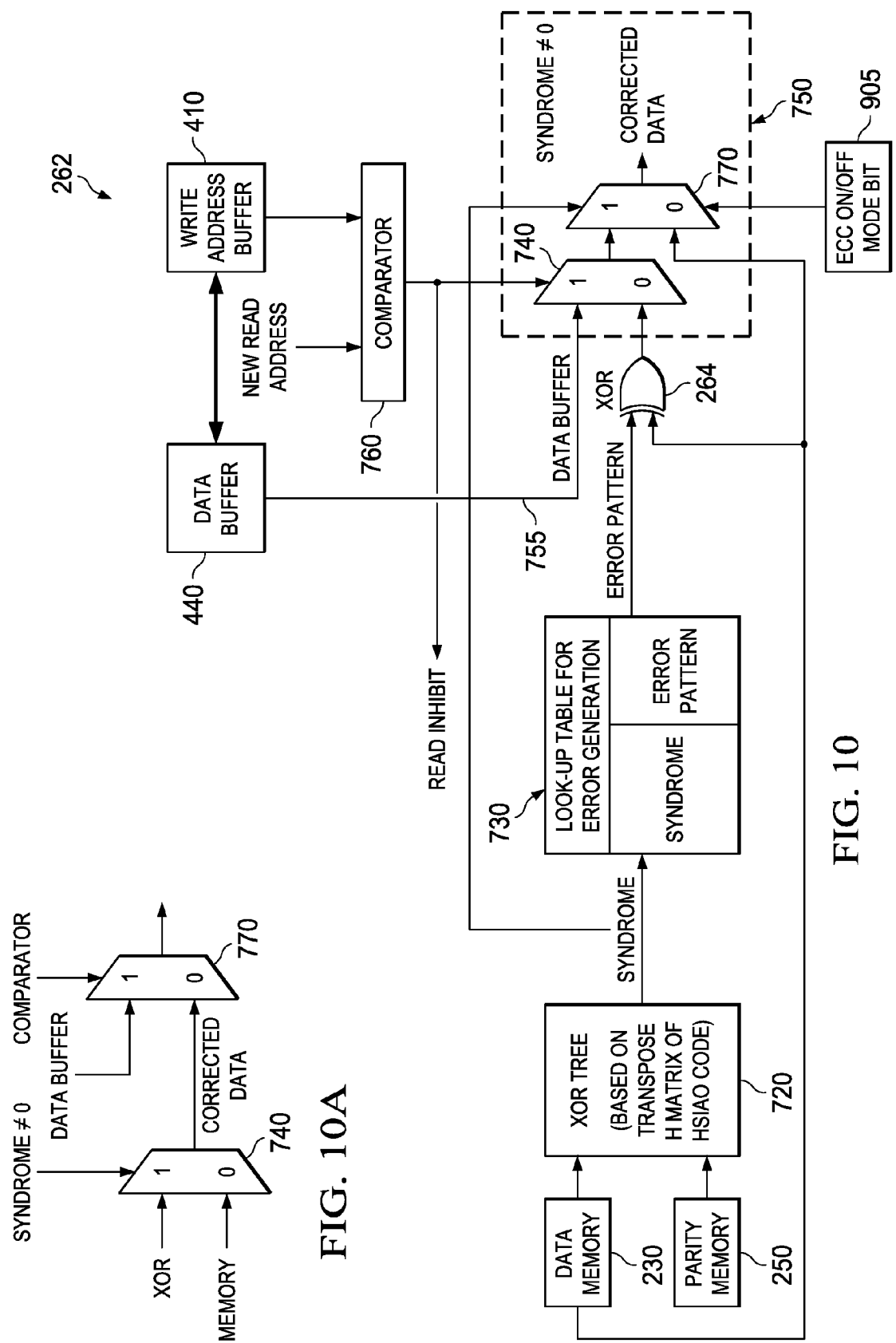
FIG. 10 is a block diagram of an inventive error correcting code decoder including inventive circuitry for error correction and ways of read bypass.

In FIG. 9, the waveforms are annotated in order here.
Clock
Write requests WR0, WR1, WR2 from CPU
Read requests RR0, RR1, RR2 from CPU
Addresses A, A+i, A+j, A+k from CPU
Write addresses A, A+i, A+k from ECC controller 246 to parity memory 250
Parity Write request PWR0, 1, 2 from ECC controller 246 to parity memory 250
Read address A+j from ECC to parity memory responds to read request RR1
Read request PRR1 from ECC to parity memory
Note that no Read requests from ECC controller 246 to parity memory 250 are used to effectuate the read requests RR0 and RR2 because read requests RR0 and RR2 are serviced by the write data buffer 440 in FIG. 10. Write request WR0 enters address A into address buffer 410, and upon read request RR0 an address comparator 760 in FIG. 10 detects a match between read address A and the already-entered address A. In case of match, both a memory 230 read and a parity memory 250 read are inhibited, as indicated by FIG. 10 Read Inhibit, and the read-requested (RR0) data comes from data buffer 440. Write request WR1 enters address A+i into address buffer 410, and upon read request RR1 the address comparator 760 in FIG. 10 fails to detect a match between read address A+j and any already-entered address. Accordingly, both a memory 230 read and a parity memory 250 read are activated. Note also in FIG. 9 the dual-port parity memory 250 accommodating the concurrent parity memory write PWR1 to address A+i and parity memory read PRR1 from address A+j to service requests WR1 and RR1. Write request WR2 and read request RR2 are analogous to WR0 and RR0 in that they are serviced by the write data buffer 440, except that the matching address is A+k.

FIG. 10 details interconnected portions of the ECC Parity Decoder 262 of FIG. 2 with the ECC Encoder 242 of FIG. 2. In FIG. 10, the Decoder 262 architecture provides remarkable structures 740, 760, 770 shown enclosed in dotted lines 750 for throughput improvement in a read path. Moreover, a parity-decoding XOR tree 720 is remarkably based on transpose H matrix of Hsiao code of FIG. 20 to more rapidly produce a Syndrome from data bits from main memory 230 (Data Memory) and parity bits from Parity memory 250 of FIG. 2 for a given Read address. A Look-up table 730 stores each error generation output associated with each respective possible Syndrome value. The Look-up table 730 thus generates an Error pattern output from a particular current Syndrome value input from the XOR tree 720. In the decoder 262 the XOR tree 720 detects if an error exists in the data being read from the memory 230. XOR tree 720 corresponds to the transpose of H matrix for Hsiao code, see FIG. 20, and outputs the syndrome. The Look-up table 730 indicates uniquely the bit position where the data is in error. The Look-up table 730 is indexed by the syndrome, and outputs the error pattern one-hot encoded.

In FIG. 10, Read throughput improvement for the ECC Decoder 262 is achieved by local write buffers 410, 440 usage for Read. Pipelined ECC introduces latency. Some embodiments remarkably improve throughput even with pipelined ECC by usage of the internal write address buffer 410 and write data buffer 440 of FIG. 4. For every write access from the CPU, the data and address are first stored into the write data buffer 440 and write address buffer 410 respectively. The greater the depth B of each buffer 410, 440, the more improved are the chances of throughput T improvement. If a read access happens for at a recently write-accessed address, the decoded data do not come from memory 230 but instead come from the write data buffer 440 and are muxed by a MUX 740 to bypass main memory 230 and parity memory 250, as well as bypass ECC XOR 720, Look-up table 730, and XOR error correction 264. Moreover, note that operations in FIGS. 7 and 7A anticipatorily read data during dummy cycles from the memory in the locality of the buffered write data and also buffer that anticipatorily-read data substantially in the ECC encoder in the data buffer 440 therein. Subsequent reads bypass memory in the case of such buffered anticipatorily-read data as well, further improving throughput. This structure and process embodiment solves the throughput problem posed by FIG. 1 earlier hereinabove by introducing a remarkable bypass circuit 750 of FIG. 10 to link the ECC Encoder 242 via a line 755 to the output of the ECC Decode 262, 264 in FIGS. 2 and 10.

In FIG. 10, a comparator 760 compares a new read address with write addresses in the Write address buffer 410. If a match is detected, then comparator 760 supplies a signal to a Read Inhibit line to inhibit a read from memory 230 and parity memory 250. If a match is detected, then the new read address (or its matching buffer 410 address or a corresponding write data buffer pointer) activates transfer of corresponding write data from the write data buffer 440. That data is transferred through the MUXes 740 and 770 in bypass circuit 750 to become data output from FIG. 10 on the line labeled Corrected Data. As shown in FIG. 10, MUX 740 has one input fed by write data buffer 440 and another input fed by XOR 264, while a MUX 770 has one input fed by the output of MUX 740 and another input fed by memory 230.

FIG. 10A shows re-arranged selectors and alternative MUX couplings for write data buffer W.D.B. 440 and memory Mem 230 relative to FIG. 10. In FIG. 10A, the write data buffer 440 is instead selected by MUX 770 in response to the comparator 760 if the write address buffer 410 holds the pertinent (matching) address to which the read pertains. If that address is absent, the output of MUX 740 is selected by the MUX 770. MUX 740 has its selector control responsive to an absence of error (syndrome=0 at syndrome generator output) to select uncorrected memory 230 read data (Mem). That way, if no error, mux 740 for timing purposes bypasses the error correction circuitry including the XOR error corrector 264 and the Lookup table 730. If a memory 230 data error is detected (syndrome not 0), then MUX 740 in FIG. 10A selects the XOR 720 error correction circuitry output.

Either way, the circuits of FIG. 10 or 10A are each an example of an electronic circuit that has a read bypass circuit coupled between the ECC encoder and decoder to pass data from the write buffer 440 when the write buffer already includes write data that is to be obtained by the memory read. In some embodiments, the read bypass circuit disables or otherwise obviates the memory 230 read as well, such as by using the comparator 760 output as a read inhibit to both memory 230 and parity memory 250. The read bypass circuit also bypasses the error correction circuitry 730, 264 with respect to a memory read when syndrome generator 720 indicates no error.

In both FIGS. 10 and 10A, the read bypass circuit has a multiplexer circuit that selects a first input based the memory read (e.g. from memory itself, or from XOR based on memory) or a second input based on the write buffer depending on whether the write buffer already includes write data that is to be obtained by the memory read.

Figure 11:
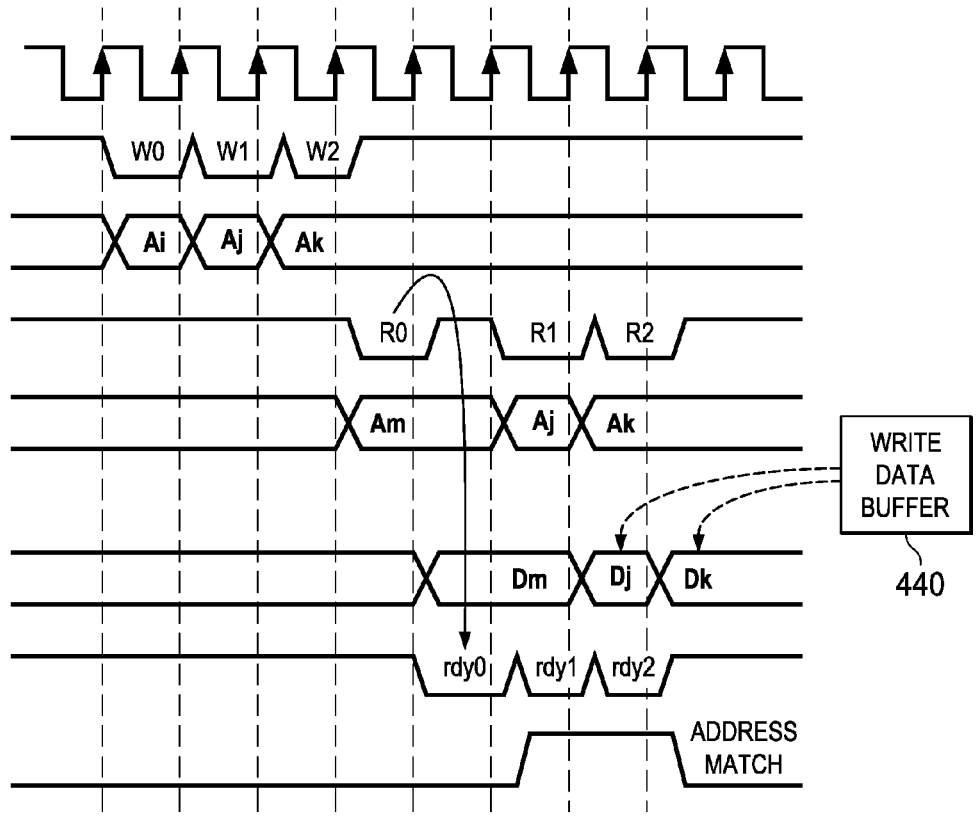
FIG. 11 is a waveform diagram versus time and showing waveforms in an inventive process of operation in FIG. 10 such as for read bypass out of the write data buffer of FIGS. 4 and 10.

In FIGS. 9 and 11, the timing diagrams show throughput improvement by pipelined ECC for read. The waveforms in FIG. 11 are:

Clock
Write requests W0, W1, W2 from CPU
Write addresses Ai, Aj, Ak from CPU
Read requests R0, R1, R2 from CPU
Read addresses Am, Aj, Ak from CPU
Read Data Dm, Dj, Dk to CPU
Read ready rdy0, 1, 2 to CPU
Address match: active high. (Bottom waveform from FIG. 10 comparator 760)

In FIG. 11, note that Read address Aj matches with previous write address Aj, and read address Ak on next cycle matches with write address Ak. So for these two addresses (Aj, Ak), the read data will come from Write Data buffer 440 of FIG. 10. This process bypasses ECC decoder, hence the data does not face any pipeline latency as contrasted with the latency faced beforehand by read address Am.

Figure 12:
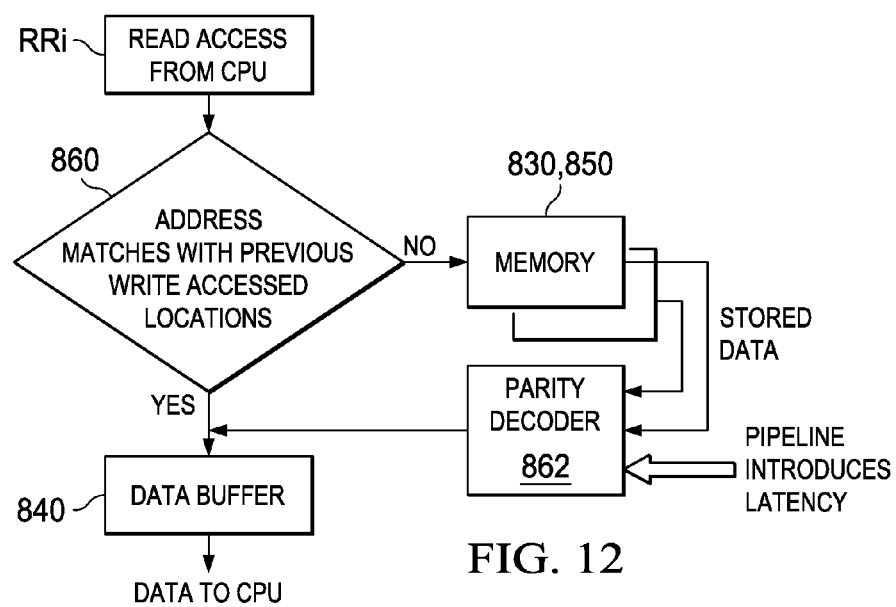
FIG. 12 is a flow diagram of an inventive process of operation in FIG. 10.

FIG. 12 provides a flow diagram for throughput improvement in pipelined ECC for Read in FIGS. 10 and 11. Trailing digits of numerals for structures in FIG. 10 and process steps in FIG. 12 correspond for easy comparison. In FIG. 12 a read access RRi is initiated from CPU or from another data accessing system module. A decision step 860 determines whether the address matches with previous write-access locations identified in the write address buffer 410. If not (No), then concurrent read accesses 830, 850 are delivered to the main memory 230 and the parity memory 250, whereupon stored data for that memory address is transferred to the parity decode process 862. That collective pipeline introduces latency to ultimately produce Data from XOR 264 of FIG. 10 to CPU. On the other hand, if an address match is found (Yes) at step 860 in FIG. 12, a distinct access 840 is made directly to the write data buffer as internal buffer instead and delivers data to CPU that bypasses and eliminates the just-mentioned decode pipeline latency.

Figure 13:
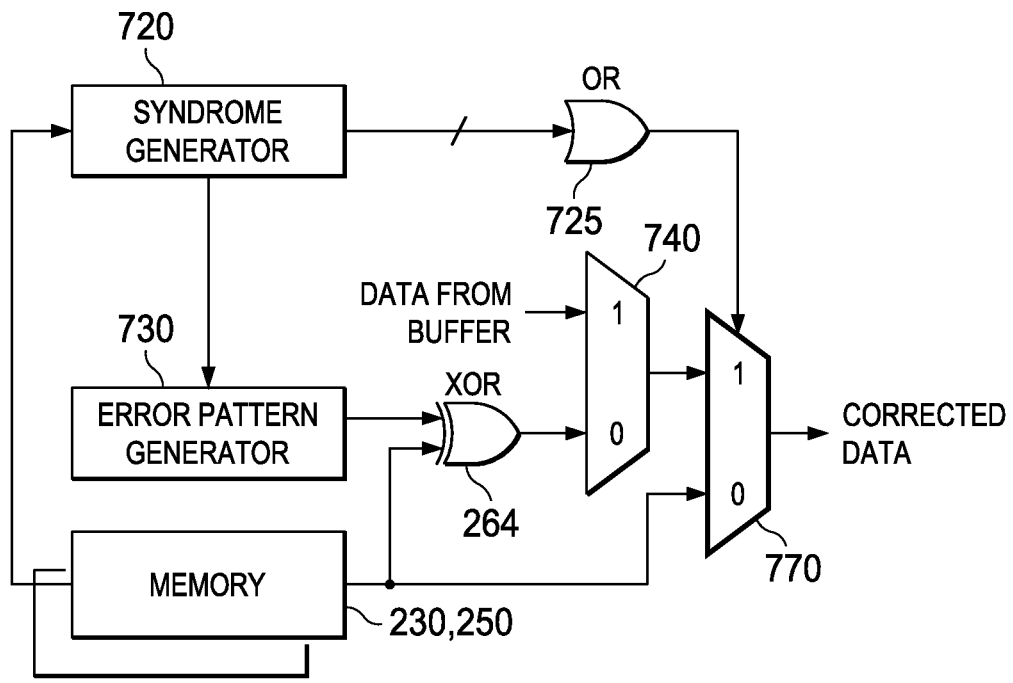
FIG. 13 is a block diagram of an inventive error correcting code decoder including inventive circuitry for error correction and ways of read bypass, for comparison with FIG. 10.

FIGS. 13 and 10 show circuitry for timing improvement in an ECC decoder combinational circuit. It is believed that conventional ECC has often used Hamming code for single error detection and double errors detection (SECDED). But Hamming code needs a large XOR circuit block for parity calculation. A type of embodiment for ECC solution here uses Hsiao code for SECDED operation. Hsiao code uses a smaller number of logic gates for parity calculation. For 32 bit data, two fewer 2-XOR gate levels are used in the syndrome generator 720 of FIG. 13 (e.g., XOR tree 720 in FIG. 10) to process Hsiao code compared to Hamming code, thus improving timing and speed as shown in TABLE 2. The matrix operations involved with Hsiao code are described later hereinbelow in connection with FIGS. 19 and 20.

TABLE 2

PERFORMANCE OF ECC CODES

| CMOS technology | Hamming code (32 bit data) | Hsiao code (32 bit data) |
|---|---|---|
| 90 nm | 1.02 GHz | 1.25 GHz |
| 65 nm | 1.43 GHz | 1.67 GHz |

Another timing problem involves the ECC decoder 262. Suppose:

i) ECC decoder is a two step process. First step 720 generates the syndrome. The syndrome calculation takes almost the same delay as the encoder. This involves the multiplication of the H matrix (FIG. 20) with the received vector.

ii) The second process step decodes the syndrome and generates the error pattern based on the syndrome. The error pattern generator 730 or lookup table effectively decodes the syndrome and supplies the error pattern. This error pattern is XORed by XOR 264 with the received data to correct the error.

In some embodiments, if the Syndrome is all zero, it means no error has happened. A timing improvement embodiment in FIGS. 10, 10A and 13 structures the ECC decoder circuit 262 so that if the syndrome is all zero, as detected by OR circuit 725, the second process is bypassed. In FIGS. 10 and 13, a MUX 770 is introduced at the data output of ECC decoder circuitry. The select line of the MUX 770 comes from a signal which is generated from the ORing 725 of all syndrome bits. This means that if the syndrome is all zeroes, the MUX 770 directly passes the received data around the error processing, else the data will go through the second error process (ii) described above and involving blocks 730 and 264. MUX 770 lets good received data bypass the error processing. So if the data is correct i.e. syndrome is all zero, the received data does not go through the error pattern generator 730 and XOR data correction 264 and any delay therein is obviated.

TABLE 3 summarizes an ECC encoder and decoder combination of FIGS. 2, 4, 5 and 10 with Hsiao ECC and write-read buffering that uses 32 bit data and 8-data buffer depth B.

TABLE 3

ECC ENCODER AND DECODER EMBODIMENTS

| CMOS Process | Area (NAND gate equivalents) | Freq (GHz) |
|---|---|---|
| 90 nm | 4K | 1.25 |
| 65 nm | 4K | 1.67 |

Below TABLE 4 shows throughput improvement in partial write of FIGS. 4, 5 and 8 for 32 bit data and up-to-8-data buffer depth B. For zero (0) depth buffer, it is assumed the ECC encoder of FIG. 2 would take 3 cycles for a complete partial write. Improved throughput T is given by Equation (1) and the "3" cycles is entered in two places in Equation (1):

$$\frac{(P \times 3 + (100 - P))}{(100 - P) + \frac{P \times 3}{B}}, \text{For } B > 0 \tag{1}$$

Figure 14:
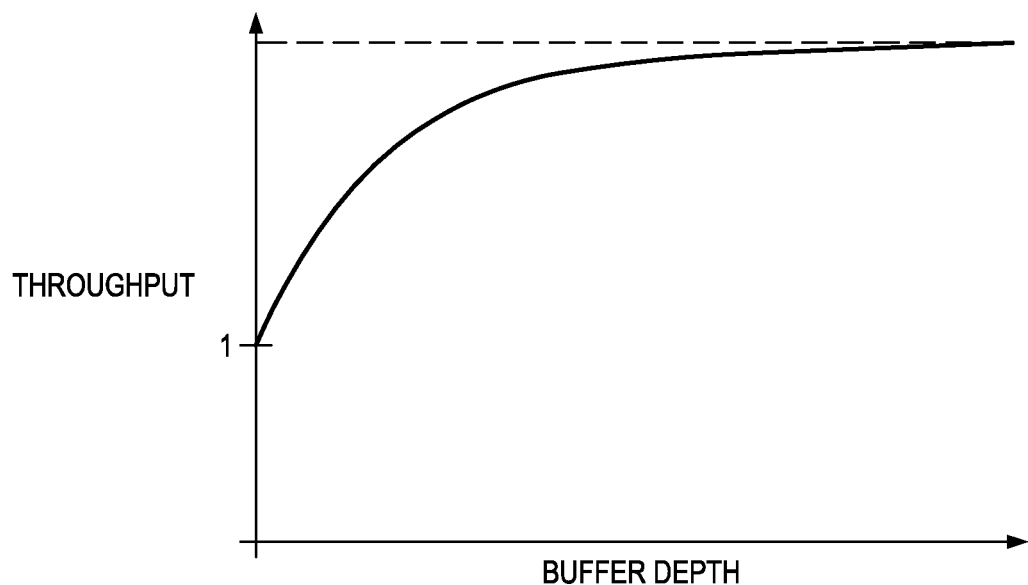
FIG. 14 is a graph of throughput versus depth of the data buffer in the inventive circuits of FIGS. 4, 10 and 23/23A.

FIG. 14 shows the write throughput of Equation (1) asymptotically meeting a line parallel to X-axis. The proportion P % of consecutive partial writes in applications code is held constant in Equation (1), and throughput T is graphed on the vertical axis in FIG. 14 as a function of the buffer depth B. In other words proportion P % is a parameter in Equation (1) defining a family of curves each like the one in FIG. 14 but with different write asymptotes of Equation (1.1):

$$\text{Asymptote} Wr = 1 + Px3/(100-P) \tag{1.1}$$

Compare FIG. 14 and Equation (1) with the tabulated values of TABLE 4 that show similar asymptotic behavior.

TABLE 4

THROUGHPUT OF PARTIAL WRITES

| Consecutive partial writes (P %) in app code | Data Buffer depth B | Normalised current throughput T, in mbps |
|---|---|---|
| 10 | 0 | 1 |
| 10 | 2 | 1.14 |
| 10 | 4 | 1.22 |
| 10 | 8 | 1.27 |
| 20 | 0 | 1 |
| 20 | 2 | 1.27 |
| 20 | 4 | 1.47 |
| 20 | 8 | 1.59 |

Below, TABLE 5 shows throughput improvement in the read case of FIGS. 10 and 12 for 32-bit data and up-to-8-data buffer depth. As with TABLE 4, further values for all the columns and using deeper buffers can be provided to extend TABLE 5. Improved throughput T is given by Equation (2), and the variables are defined in TABLE 5. Pipeline depth-related parameter d is d=# of decoder ECC pipeline depth plus one.

$$\frac{d \times 100}{2 \times (100 - R) + \frac{R}{B}}, \text{For } B > 0 \quad (2)$$

The read throughput of Equation (2) is tabulated in TABLE 5. When throughput T is graphed as a function of buffer depth B it has a similar asymptotic shape as depicted in FIG. 14 but arising from the distinct read throughput Equation (2) instead of write throughput Equation (1) earlier hereinabove. Note also that the TABLE 5 parameter R % of Read access matching with write address stored in buffer for purposes of read throughput is different from the TABLE 4 parameter P % of partial writes.

TABLE 5

THROUGHPUT FOR READS

| R % of Read access matching with write address stored in buffer | Data Buffer depth B | Normalised current throughput T, in mbps |
|---|---|---|
| 10 | 0 | 1 |
| 10 | 2 | 1.08 |
| 10 | 4 | 1.10 |
| 10 | 8 | 1.11 |
| 20 | 0 | 1 |
| 20 | 2 | 1.18 |
| 20 | 4 | 1.21 |
| 20 | 8 | 1.23 |

Silicon test strategy: An innovative, yet simple silicon test process embodiment is provided for verification of the ECC architecture of FIGS. 2, 4, 5 and 10, and as applied in a memory-and-bus system of FIG. 16 to serve a CPU. To achieve this, a memory mapped register Mode bit 905 in FIGS. 4, 10 and 15 is utilized for enabling or bypassing ECC functionality such as by forcing enables and mux selections appropriately in FIG. 4 or 23, and 10 or 10A.

Figure 15:
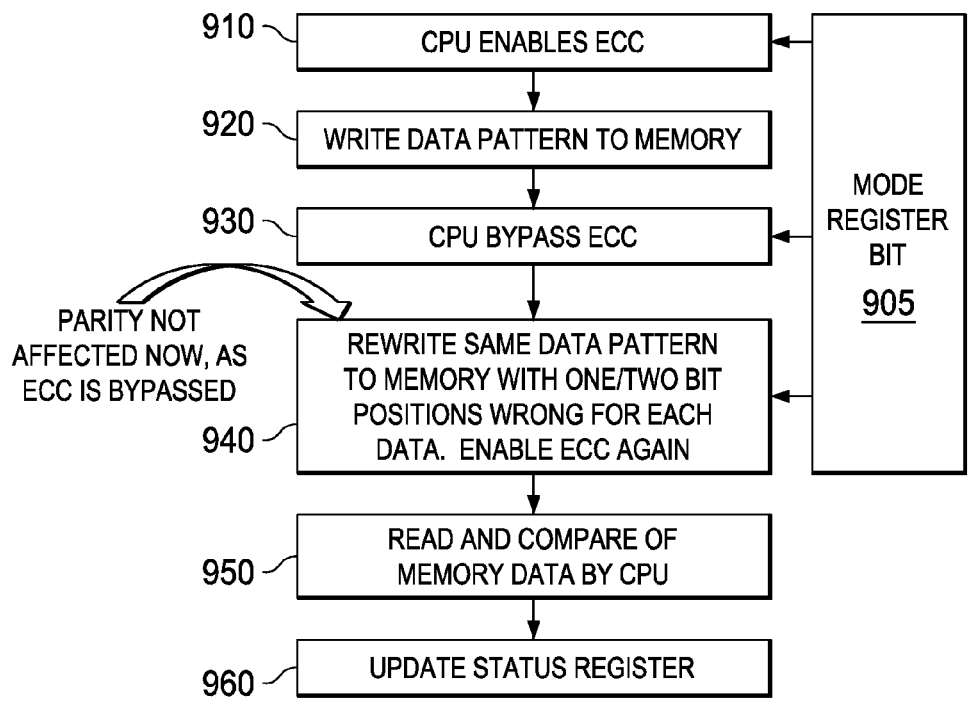
FIG. 15 is a flow diagram of an inventive process of silicon ECC test in manufacturing and ECC test in use in the field.

FIG. 15 shows a flow diagram for Silicon test, wherein the steps for testing Type-1 and Type-2 embodiments suitably include the following:

Enable ECC functionality at step 910. Write a fixed or sequential or otherwise pre-established data pattern into memory 230 at a step 920. Parity is also calculated by ECC and written into parity memory 250. Then a step 930 disables ECC by the setting of memory mapped register 905 to Mode=1. A succeeding step 940 rewrites memory 230 with one/two bits wrong at every memory location at any random bit position. (Parity not affected now, as ECC 480 is bypassed or disabled in FIG. 4.) ECC is enabled again by setting of memory mapped register 905 to Mode=0. A further step 950 reads all memory locations of memory 230 and compares them. ECC corrects single errors in step 950, so that comparison of the read data thus corrected should match the data pattern originally written in step 920. Then a step 960 updates an error status reporting register and/or error log store with the results of the comparisons. Uncorrected data can also be stored and analyzed. If errors are randomly scattered over bit positions and numerous read data, then soft error may be evident. If error exists in a same bit position over numerous uncorrected read data, then hard error in a memory or bus may be involved. And both soft and hard types of error may exist.

Figure 16:
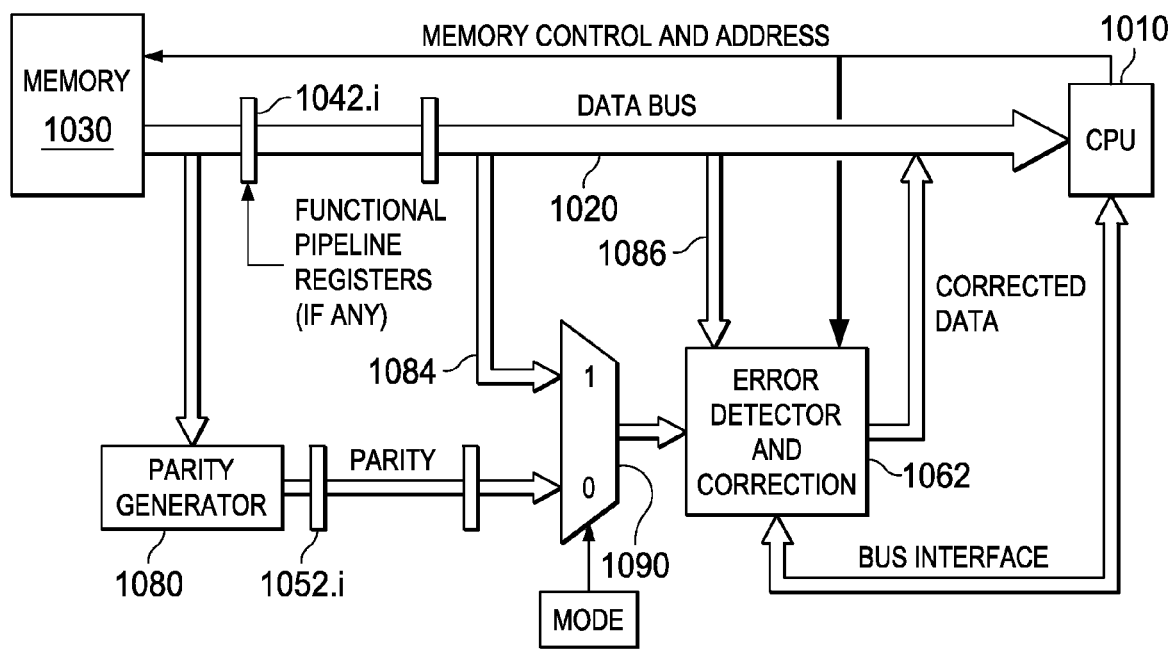
FIG. 16 is a block diagram of an inventive ECC circuit (Type-2) for supporting various inventive testing modes such as shown in FIGS. 17 and 18.

In FIG. 16, a Type-2 ECC embodiment provides protection herein against bus errors like crosstalk, and also detects memory failure offline. The arrangement is as system non-intrusive as possible, and it provides support for online checks (ECC mode) for hard/soft errors in a bus. Further it provides support for offline checks (BIST mode) for hard/soft errors in memory and bus. No additional parity memory is required.

In FIG. 16, the Type-2 ECC embodiment has the following components. Parity Generator module 1080 generates parity and uses Hsiao code as in FIGS. 4 and 19. The structure can be the same as Type-1 ECC architecture parity generator 480 in ECC encoder of FIGS. 2, 4 and 5. Note, however, that Type-2 ECC in FIG. 16 economically has no parity memory to store parity. A Mode MUX 1090 is fed at one input by the parity generator 1080 directly. Note that the Data bus 1020 is a long bus with none, one or more pipeline registers 1042.i, and parity generator 1080 is coupled along parity lines provided with similar delay such as with none, one or more parity pipeline registers 1052.i. Error Detector and Correction 1062 is based on the Hsiao code as in FIGS. 10 and 20. The structure 1062 is suitably made the same as the Type-1 ECC embodiment of the decoder at FIG. 10 with blocks 720, 730, 264. Bus data enters on unmuxed arrow 1086 to Error Detector 1062, and parity enters Error Detector via mode MUX 1090 either along arrow 1084 from bus 1020 (Mode 1) or from Parity Generator 1080 (Mode 0).

One or more Error counters are included in FIG. 16 Error Detector and Correction block 1062. Such Error Counter gets updated in the process embodiments of FIGS. 17 and 18 when multiple errors happen in any data. Single error gets corrected (SECDED) so the counter does not change. The counter decrements when an interrupt is serviced. Error buffers log the values of incorrect data. An Interrupt generator module generates interrupt to CPU whenever a multiple error happens in data.

In FIG. 16, the Type-2 ECC embodiment is a very elegant and low cost ECC solution for bus errors correction and which detects memory error or failure. Type-2 ECC saves even more chip real estate and expense because it has no parity memory to store parity. Some Type-2 ECC embodiments omit the error pattern generation 730 and/or error correction 264 for even further economy.

Type-2 ECC has two modes of operation. Mode 0 is an online functional mode that provides ECC functionality to a bus. In FIG. 16, when Mode=0 to establish online functional mode, the Type-2 ECC circuitry provides ECC for bus 1020 and targets soft bus errors like crosstalk and hard bus errors like open/short due to electro-migration. An interconnect metal sub-system covering long bus routes can involve crosstalk errors that can arise from multiple bus signals and their transitions.

This FIG. 16 ECC embodiment performs the tasks of monitoring such bus systems and providing an error indication. An error correction mechanism is also provided, and the bus data is encoded suitably. Two processes or methods of testing respectively include: (i) Additional check bits are used. For this, either the data path is augmented to generate check bits, or check bit generators such as in parity generator 1080 are appended at the source logic which drives the bus. Then online testing (error detection and possibly also including correction) is performed using the ECC module 1080, 1090, 1062.

Testing on the original data bus 1020 without any check bits is re-encoded into a test program to create the data bits and check bits and the same ECC module 1080, 1090, 1062 is used. This is an example of periodic off-line testing, since the re-encoding is applicable only during the test phase, which can be enabled periodically.

In Type-2 circuitry of FIG. 16, testing of the memory 1030 and separate testing of the bus 1020 are available. Memory contents are suitably tested offline when BIST_mode=1, and the bus is tested online with ECC blocks 1080 and 1062. In this way CPU BIST tests the memory 1030 and ECC tests the bus 1020. Parity generator 1080 at the output of the memory 1030 provides check bits to ascertain the correctness of the data on the memory read bus at the point where the bus data is latched, and is different or distinct from the parity generator used to compute the parity bit when performing a memory write operation.

ECC works online in a first testing operation case that tests all the data lines of the bus 1020 with the help of the parity generator 1080. Whatever data is launched on the bus 1020 is sent to parity generator 1080 as well. Parity is also sent on separate parity bus. At the receiving end, data on data bus 1020 and parity bus is captured and checked for any error by the Error Detector and Control module 1062.

A second case, an offline mode, tests some of the data lines of the bus 1020 while sending CPU software-generated parity down some of the other data lines in bus 1020. CPU software generated data and corresponding parity are written into memory 1030 and read data (including data and parity thus-read) is sent on data bus 1020. At receiving end, the Error Detector and Control module 1062 checks for any error as both the data and parity bits are present on the bus 1020.

Some embodiments are specialized for particular testing or application circumstances and provide only error detection or provide error detection with error correction as well.

FIG. 16 illustrates the combined case wherein ECC module 1062 takes care of both single error correction and double error detection.

Some embodiments include two such ECC modules positions for testing in both reverse directions on bus 1020 such as with intercommunicating bus masters/slaves that have memories, caches or other stores in them. In this way, testing and error correction of both blocks 1010 and 1030 as well as bus 1020 is performed. Also, error correction in some embodiments is performed on not only on data but also addresses and control lines. Some embodiments perform error correction stepwise, so that information on a bus is error corrected when conveyed from source to destination, and data from the destination is again error corrected on a read from the destination, and the bus is again error corrected for bus error when data from the destination is conveyed back to the source block. In this way, error buildup and multiple errors are reduced for any given error correction step.

Figure 17:
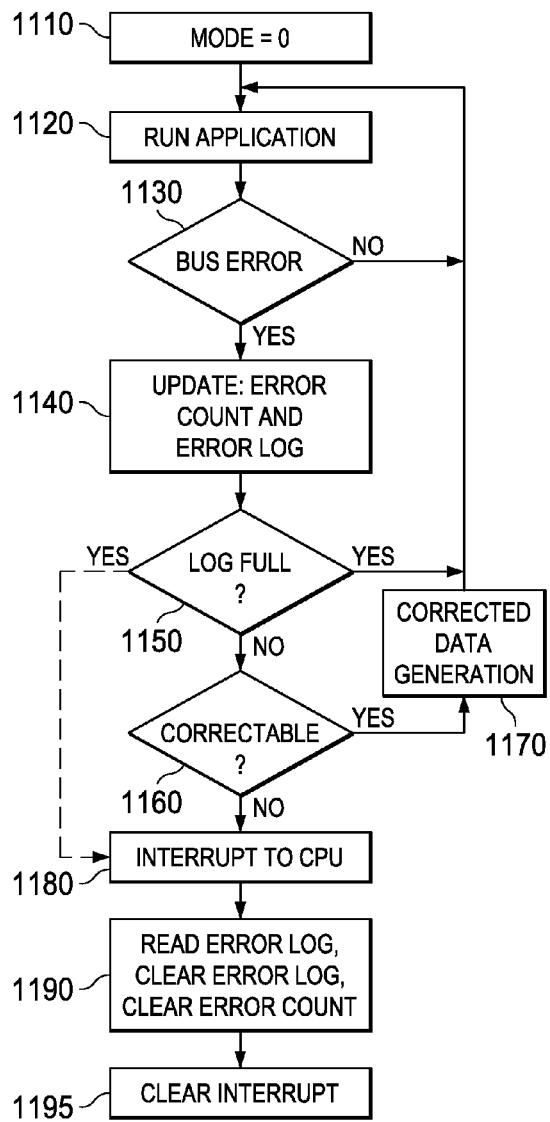
FIG. 17 is a flow diagram of an inventive ECC test process for use with the inventive ECC circuits of FIGS. 2, 4, 10, 16 and 23/23A.

FIG. 17 depicts a BUS BIST mode operational sequence to support step 1110 Mode 0 of FIG. 16. Mode 0 in FIGS. 16 and 17 runs with normal application code. Mode 0 can be enabled during normal application code execution to provide a concurrent on-line test that tests for soft and hard errors on buses and supports fail log generation and error correction.

In FIG. 17, a process embodiment for this BUS BIST mode runs an application in step 1120 (Run with Functional mode) until a bus error (Yes) is detected by a decision step 1130, whereupon Test mode operation at a step 1140 maintains an error count and a log that can be read any time. A decision step 1160 determines whether a latest Error is correctable. If correctable, corrected data is generated by step 1170 in FIG. 16 and the application 1120 continues. If the data is not correctable at step 1160, a step 1180 sends an interrupt to the CPU to flag the uncorrectable data error, and CPU can read and clear the log and possibly take remedial action regarding the particular application and the system. The interrupt can be cleared by CPU. The step 1140 error log is updated until a step 1150 detects that the log is full whereupon a Full flag can be set, the application 1120 continues, and the log can also be analyzed subsequently. For example, when the Full flag is set, an interrupt 1180 is activated, and then CPU operations 1190 Read the Error log and Error count, and the BIST clears the Error log and clears the Error count, whereupon a step 1195 clears the interrupt.

Figure 18:
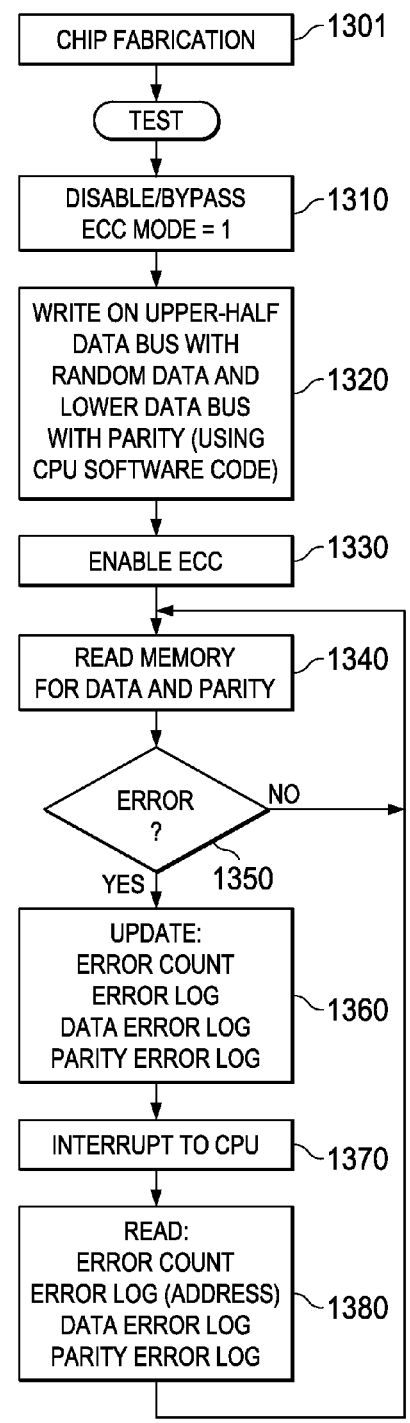
FIG. 18 is a flow diagram of another inventive ECC test process for use with the inventive ECC circuits of FIGS. 2, 4, 10, 16 and 23/23A.

In FIGS. 16 and 18, another mode, Mode 1, is a test mode for use mainly to detect memory errors or failure. ECC logic 1062 with the additional Mode MUX 1090 of FIG. 16 realize this mode. When Mode=1, the Type-2 ECC embodiment works as CPU BIST for the bus 1020 using ECC. A test program or pseudo-code running on CPU 1010 writes a data pattern and corresponding parity into the main memory 1030. Each data memory word is split between data bits and parity bits. Soft errors pertaining to either or both of memory 1030 or bus 1020 are detected. This mode can be run periodically during application code. To that extent, it is online but not concurrent. Depending upon actual or pseudo-code, correction may or may not be useful (for a functional purpose as contrasted with usefulness for a test purpose). The testing may be offline due to pseudo code execution, except that it is suitably on-line when the code is functional.

In FIG. 18, a test process embodiment supports Mode 1. In a manufacturing process embodiment, chip fabrication 1301 is followed by Test. It has a sequence of steps:
Disable/Bypass ECC, Mode=1 at step 1310.
Write according to a step 1320 on Upper-half data bus with random data and lower data bus with parity (using CPU software code).
Enable ECC at step 1330.
Read memory for data and parity according to a step 1340.
If no error at a decision step 1350, cycle back to Read step 1340; if Error then continue:
Update step 1360: Error Count, Error log, Data Error log, Parity Error Log.
Interrupt to CPU at step 1370.
Read by CPU at step 1380: Error Count, Error log (address), Data Error log, Parity Error Log.
Then go back to step 1340 to further Read memory for data and parity.

In FIG. 16, some testing embodiments are used with a bus 1020 that includes data lines and parity data lines. Testing circuitry is selectively operated to conduct a first test of the data lines and parity data lines with parity generator 1080 deselected, and then perform a second test of at least the data lines with the parity generator 1080 selected. The testing circuitry can include a third test of that compares parity from the parity data lines with parity from the parity generator 1080 by alternately selecting and deselecting the parity generator 1080 using MUX 1090 in FIG. 16 and comparing the parity data from each.

Summarizing, the Type-1 ECC architecture embodiment has advantages of using Hsiao code for low real estate area expense and reduced timing overhead. For partial write access, it improves throughput. Throughput improvement is a benefit for pipelined ECC in a system with an ECC-pipeline-unaware CPU 110, i.e. the CPU is not aware of this ECC pipeline.

The Type-2 ECC architecture embodiment has advantages of not only using Hsiao code for less timing overhead but also presents very low real estate area expense, almost 2.2 K in some embodiments due to its architectural simplicity and lack of parity memory 250. The Type-2 ECC architecture embodiment does not need parity bits, conducts periodic offline test without parity generator 1080, performs periodic online test with parity generator 1080, and can be extended to in-system bus BIST easily. In the layout, the parity generator 1080 and error detection and correction module 1062 are respectively placed at the beginning and end of the bus 1020, or otherwise at different places along the bus such as places where functional blocks connect to bus 1020, for more effectiveness.

Figure 20:
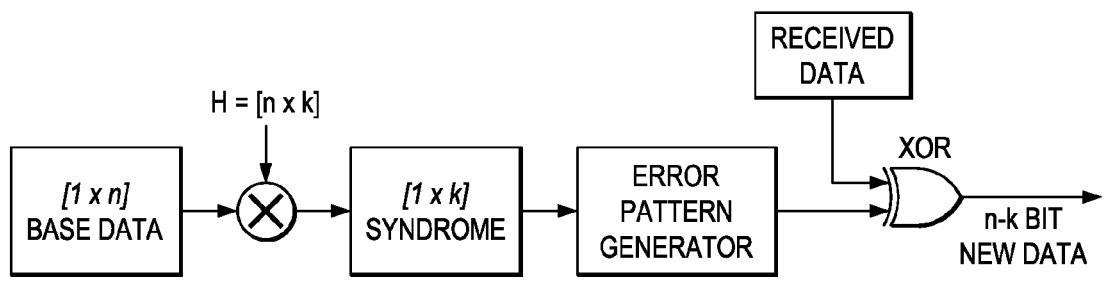
FIG. 20 is a flow diagram for an example of ECC decoding in FIGS. 2, 10, 12, 13, 16 and 23/23A.

In FIGS. 19 and 20, ECC basics and Hsiao code are illustrated and described. In the ECC encoding of FIG. 19, a data vector of [n–k] bits is modified to [n] bits data by adding [k] bits redundancy for ECC operation. In the above-cited Hsiao paper, 32 data bits have k=7 additional bits; and 64 data bits have k=8 additional bits. This is accomplished by multiplying the [n–k] bits by a generator matrix G. The dimensions of G=[(n–k)×n] wherein [1×(n–k)] base data at left in Equation (3) is multiplied by generator matrix G instantiated in the encoder XOR tree 480 of FIG. 4 and produces [1×n] new data at right in FIG. 19. Matrix multiplication of incoming bit stream in FIG. 19 utilizes G matrix having two matrix blocks [G]=[I: A], where I is an [(n–k)×(n–k)] identity matrix, and A is a parity generator matrix [(n–k)×k]. (The cell entries of the last-3-column A block in the 4×7 G matrix of Equation (3) are provided as an example of an A block and to give a sense of dimensions.) Matrix multiplication in the binary domain here is understood in any appropriate way used for ECC codecs. One example can use logic-AND to multiply corresponding bits and then sum the products by elementary XOR summers that keep only a sum bit and need not have a carry bit, such that 0+0=1+1=0 and 0+1=1+0=1.

$$[0\ 1\ 0\ 1] \times \begin{bmatrix} 1000011 \\ 0100101 \\ 0010110 \\ 0001111 \end{bmatrix} = [0\ 1\ 0\ 1\ 0\ 1\ 0] \quad (3)$$

In the output vector at right in Equation (3), the information bits are 0101 and parity bits are 010.

In the ECC decoding of FIG. 20, the k-bit parity determines the capability for error detection 720, error bit-position detection (pattern generation) 730 and error correction 264. During read time of FIG. 20, the n-bit data gives a k-bits syndrome which determines the existence of error and is used by an error pattern generator 730 to determine the error bit location. The syndrome generator 720 of FIG. 13 accomplishes this by multiplying the n-bit data by [n×k] parity check matrix H. Note the dimensions of H=[n×k]. [1×n] Received Data is multiplied by H to yield [1×k] syndrome. The error pattern generator 730 of FIG. 13 (Look-up table of FIG. 10) is fed with the [1×k] syndrome. In the meantime, the n–k bits of Received Data is fed to XOR 264 of FIG. 13 along with n–k bits output from the Error pattern generator 730 to produce n–k bit new data 0101 (same as base data in Equation (3)).

For a transposed example, suppose data Pattern $1101010^T$ is the Received Data. The first bit "1" is an error since it should be "0" to be the same as the output vector above in Equation (3). The syndrome generator 720 executes Equation (4) to pre-multiply that [n×1] received data pattern with a [k×n] transposed Hsiao matrix $H^T=[A^T: I]$ instantiated in the XOR tree 720 of FIG. 10 Here, block $A^T$ has dimensions [k×(n–k)] and is the transpose of the Parity generator Matrix block A embedded in matrix G of Equation (3) above, and $H^T G^T=0$. But in Equation (4), the identity matrix I that is utilized is a [k×k] identity matrix instead. Here, the resulting example Syndrome is 011. After look-up and XOR of FIG. 13, the Corrected Data is 0101 (same as the input base data in Equation (3)). (The example cell entries of the first 4 columns for the 3×4 $A^T$ block in the 3×7 Hsiao-transpose $H^T$ of Equation (4) give a sense of dimensions and transposition.).

One method of such error pattern generation 730 in effect identifies a column of Hsiao-transpose $H^T$ that matches the syndrome (e.g. first column 011 here), and then uses XOR 264 to correct the corresponding entry in the Received Data (e.g. first bit 1 is corrected to 0). This matching is done by the Error Generator 730 either by look-up table or instantiated in combinational logic fed with the syndrome at one set of inputs and having each column of $H^T$ fed to an array of second inputs. Then the resulting vector of syndrome-match/not match outputs corresponding to the columns respectively of $H^T$ are fed in parallel to the XOR error correction circuit 264. If there is no match, the error is uncorrectable and the process of FIG. 17 responds. Generally, if there is one error, then one error-correcting match bit will go active and make the XOR circuit 264 flip its corresponding bit in the Received Data to correct the Received Data and deliver Corrected Data as output in FIG. 10.

$$\begin{bmatrix} 0111100 \\ 1011010 \\ 1101001 \end{bmatrix} \begin{bmatrix} 1 \\ 1 \\ 0 \\ 1 \\ 0 \\ 1 \\ 0 \end{bmatrix} = \begin{bmatrix} 0 \\ 1 \\ 1 \end{bmatrix} \quad (4)$$

Figure 21:
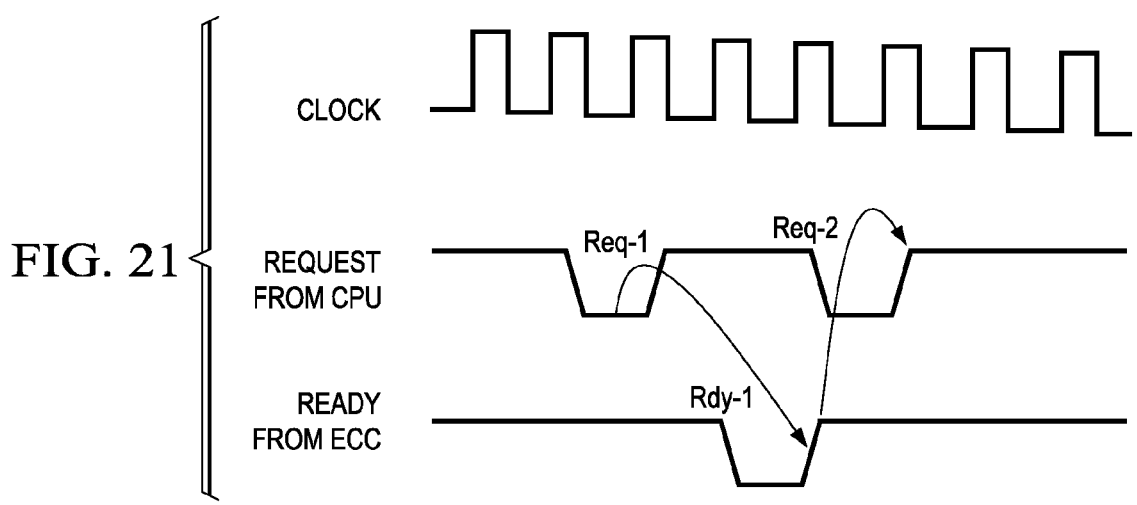
FIG. 21 is a waveform diagram versus time illustrating a throughput problem arising when a CPU is ECC pipeline-unaware, wherein the problem is solved in FIG. 2 and other Figures.
Figure 22:
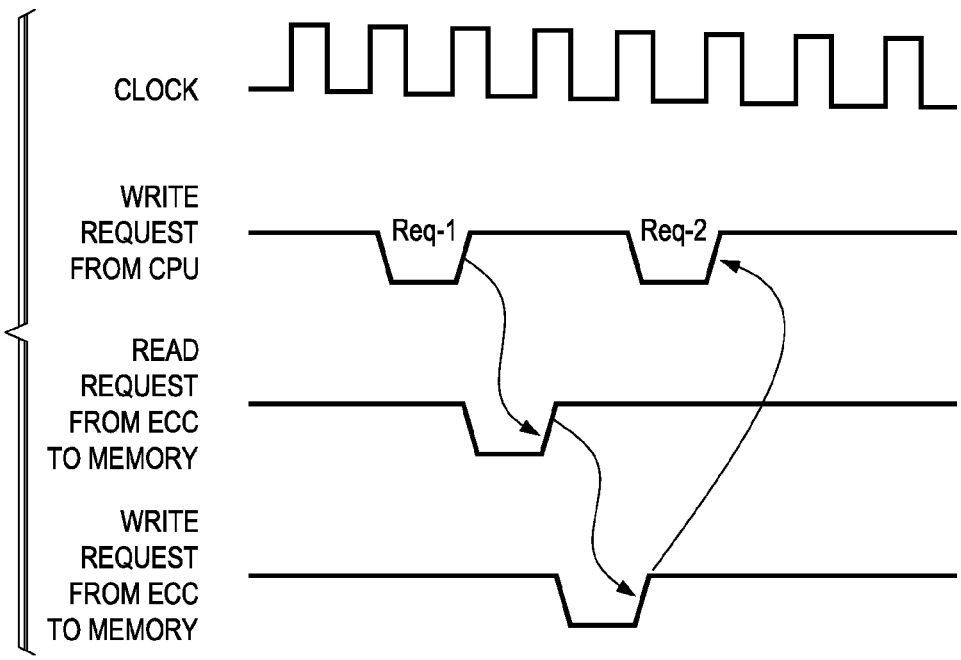
FIG. 22 is a waveform diagram versus time illustrating a throughput problem arising in case of a partial write access, wherein the problem is solved in FIGS. 4, 5 and 23/23A and other Figures.

FIGS. 21 and 22 describe problems in FIG. 1 and discussed and solved in connection with FIG. 9.

In FIG. 21, assume that two depth pipeline is used for ECC parity encode and decode. The CPU assumes no pipeline for memory access. So when it will send a request Req-1, the ready from ECC will come, e.g. after 2 cycles. CPU will not send a second request Req-2, until it samples the ready Rdy-1 for previous request. Effectively, this process reduces throughput of CPU-memory access.

In FIG. 22, the CPU sends a partial write request. But the ECC will internally need to get the rest of the data from memory at the location accessed by CPU to properly calculate the parity. This need will initiate a read from memory from ECC. This internal read operation will reduce the throughput whenever the partial write access is requested from CPU. Suppose a negative edge were used for issuing read access from ECC for partial write access. In that case, the ECC-to-memory access path would be a half-cycle, which will create burden for high speed operation (e.g., 1 GHz clock calls for half-cycle 2 GHz burden). This is also may not be permitted in serial scan test operation for ATPG testing.

If a partial write to memory happens, the ECC has to read the memory internally to correctly calculate the parity. This has impact on throughput. Suppose a negative edge flip flop were used. It would have both a timing and Testability impact. FIG. 22 depicts this issue. The problems of FIGS. 21 and 22 are solved as described for the earlier FIGS. hereinabove such as FIGS. 2-9.

In FIG. 23, an expanded illustration of the partial write improvements of FIG. 4 is shown. A lengthy description of FIG. 23 is abbreviated for conciseness where it largely parallels that of FIG. 4. On an access cycle and when PWEN=1, the Data MUX 430 passes data based on comparator 420 selection of memory or Data buffer, and MUX 430 feeds that data to Mixer 450. Mixer 450 is coupled to one input of the second MUX 470 (for selection if WEN=0). The Data buffer 440 receives data from main memory 230 along line 490 on a CPU dummy cycle thereby hiding preparatory buffering operations for beneficial use on access cycles. Controller 246 of FIG. 2 is enabled by an inactive logic state of controls from, e.g., CPU indicating dummy cycles, so that logic in Controller 246 generates a Forced Read Enable after Partial Write (FREN=1) in FIGS. 3 and 23. When thus enabled, Controller 246 executes a data read access to memory 230 to obtain such data for data buffer 440 in advance. Operations of the FIG. 23 circuit are thus coordinated with the state machine 300 of FIG. 3, and the address generation and read/write controls of the Controller 246 of FIG. 2 to accomplish the partial write functions with as little latency as possible.

Figure 23A:
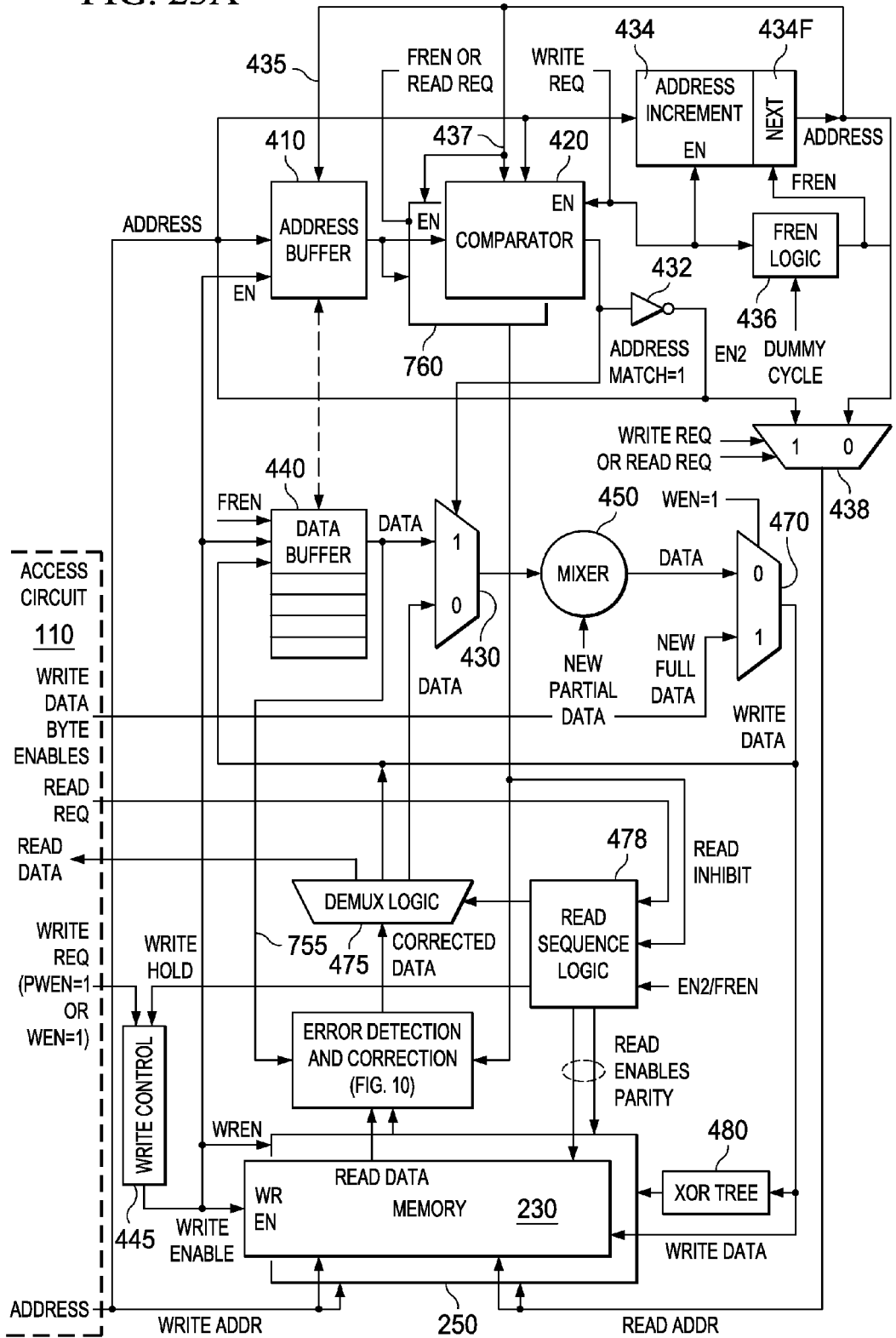
FIG. 23A is a more elaborate block diagram of an inventive alternative form of error correcting code encoder including inventive circuitry for partial write and for full write and read bypass in the inventive ECC circuits of FIGS. 2, 4 and 10.

In FIG. 23A, a further detail is shown of circuitry related to FREN and the read/write controls. A first example of operation has a CPU 110-generated address A and write request WRITE_REQ active for Partial-write PWEN=1. Address A is supplied to a Write Addr input for each of memory 230 and parity memory 250. Address A is also fed to address buffer 410 and an input of enabled comparator 420 and to an address incrementer 434 and a first input of a multiplexer 438. If comparator 420 finds an address match of the Address A with an address in buffer 410, then Data buffer 440 provides the data corresponding to that address through Mux 430 to the partial-write path 450, 470. Write Data from Mux 470 output goes to memory 230 as well as to the ECC encode circuitry including XOR encoding block 480, which delivers parity to parity memory 250. A write control circuit 445 provides a Write Enable output to enable these writes to memories 230, 250 and to data buffer 440. The Write Data from Mux 470 is fed back to Data buffer 440 to over-write and thereby update the data entry in Data buffer 440 that corresponds to address A in Address buffer 410. In the meantime, WRITE_REQ has enabled (by EN=1) an address incrementer 434 and also FREN logic 436, in addition to comparator 420. Also in the meantime, the active Address Match=1 output from comparator 420 has driven an inverter 432 low (output EN2=0) and, via Mux 438 and Read Sequencer Logic, EN2=0 thereby has prevented a memory read at address A.

Now suppose instead in FIG. 23A partial write that comparator 420 finds no address match of the Address A with an address in buffer 410. An inactive output Address Match=0 from comparator 420 drives the inverter 432 high, and inverter 432 activates Enable line EN2 (EN2=1) for Address A at a first input "1" of Mux 438. WRITE_REQ causes Mux 438 to pass the Enable EN2=1 to Read Sequence Logic 478 that activates Read Enables for memory 230 and parity memory 250 and sends a Write Hold to Write Control circuit 445. Mux 438 also passes address A (as a read Read Address) to those memories, 230 250. The memory 230 read is suitably assisted and corrected by ECC decode in Error Detection & Correction if necessary and as described in FIG. 10. Read Sequence Logic 478 also activates appropriate selection controls for a DeMux Logic 475 that feeds the thus-read data to multiplexer 430 input "0" for use in the data path 430, 450, 470. Write Control circuit 445 is already enabled by WRITE_REQ active, but is on Write Hold. Upon completion of the memory read in support of partial write PWEN=1, the Read Sequence Logic 478 terminates Write Hold whereupon Write Control 445 activates Write Enable to memory 230 WR EN and Parity memory 250 WR EN input to complete the Partial-write of Write Data from Mux 470, and also activates entry of that Write Data into Data buffer 440 and entry of the Write Address A into Address Buffer 410. In the meantime and as above, WRITE_REQ high has qualified FREN logic 436 and also has enabled address incrementor 434 to increment Write Address A to form Next Address A+1 and hold A+1 in an output flop 434F for use during a dummy cycle.

Before long, the dummy cycle condition occurs, and FREN logic 438 responds by supplying FREN=1 (active) accompanied by Next Address (A+1) to an input "0" of Mux 438. WRITE_REQ and Read Request READ_REQ are both inactive at selector input of Mux 438 during the dummy cycle condition, and so Mux 438 selects input "0" and passes the FREN=1 to Read Sequence Logic 478 and passes the Next Address (A+1) to Read Address inputs of main memory 230 and parity memory 250. Read Sequence Logic 478 responds to FREN=1 to activate Read Enables at main memory 230 and parity memory 250. The memory 230 read is suitably assisted and possibly corrected by ECC decode as shown and described in FIG. 10, and fed to Data Buffer 440 via a DeMux Logic 475. Data Buffer 440 is enabled by FREN for data entry from the memory 230 read at a pointer position corresponding to an address entry concurrently made for Next Address A+1 delivered by line 435 to Address Buffer 410.

Note that in some embodiments, a further line 437 has in the meantime supplied Next Address A+1 as well to FREN-activated Comparator 760. If the address A+1 was already in address buffer 410, comparator 760 in that case has sent a Read Inhibit to Read Sequence Logic 478 to inhibit the Read Enables for memories 230, 250. In this way, the just described FREN-based reads from memory 230 and parity memory 250 only occur when no match is found in Address buffer 410 with Next Address (A+1).

The circuitry and process embodiments of FIG. 23A as just described, are supported by ECC encode and decode circuitry as described elsewhere herein, e.g., for FIGS. 2, 4 and 10. Multiplexer 438, DeMux 475, enables Write Req and Read Req, and controls for the various circuits of FIGS. 23A and 10 are provided to any suitable extent to accomplish the various write, partial write, read and dummy cycle read, and read bypass functions taught herein so that embodiments can have any or all of such write and read functions. Corresponding to FIG. 2 Controller 246 and FIG. 3 state machine 300, various control functions in FIG. 23A are distributed, for instance, into FREN Logic 436, Write Control 445, and Read Sequence Logic 478.

The various ECC-assisted data reads from memories 230 and 250 are supported in FIG. 23A by read demultiplexer 475 fed from a Corrected Data output of FIG. 10. Read demultiplexer 475 has a first output for Data buffer 440, a second output for the Data0 input of Mux 430, and a third output to the Read Data output back to a requesting read-access circuit 110 such as a microprocessor, DMA or peripheral. Read demultiplexer 475 has a selector input responsive to Read Sequence Logic 478, and Read Sequence Logic 478 has inputs for a read-access circuit request Read Req, and for Read Inhibit, and for the EN2/FREN line selected by Mux 438. That way, Read Logic 478 responds to a Read Req to send a Read Enable to memory and operate demultiplexer 475 to supply Read Data from memory to Read Data output to the read-accessing circuit. Mux 438 selection responds to READ_REQ=1 (active) to pass the Address to the Read Address inputs of the memories 230, 250. Read Sequence Logic 478 responds to READ_REQ=1 to activate the Read Enables to memories 230, 250 and set the DeMux 475 for Read Data output. However, an address comparator 760 in FIGS. 10 and 23A is activated by Read Request and if comparator 760 detects a match, it sends a Read Inhibit to Read Sequence Logic 478 to inhibit the Read Enables to the memory 230 and parity memory 250. Instead, Data Buffer 440 provides the read bypass data on line 755 and this passes through FIG. 10 muxes 740, 770 (or FIG. 10A Mux 770) and through Demux logic 475 in FIG. 23A to the Read Data output.

Figure 24:
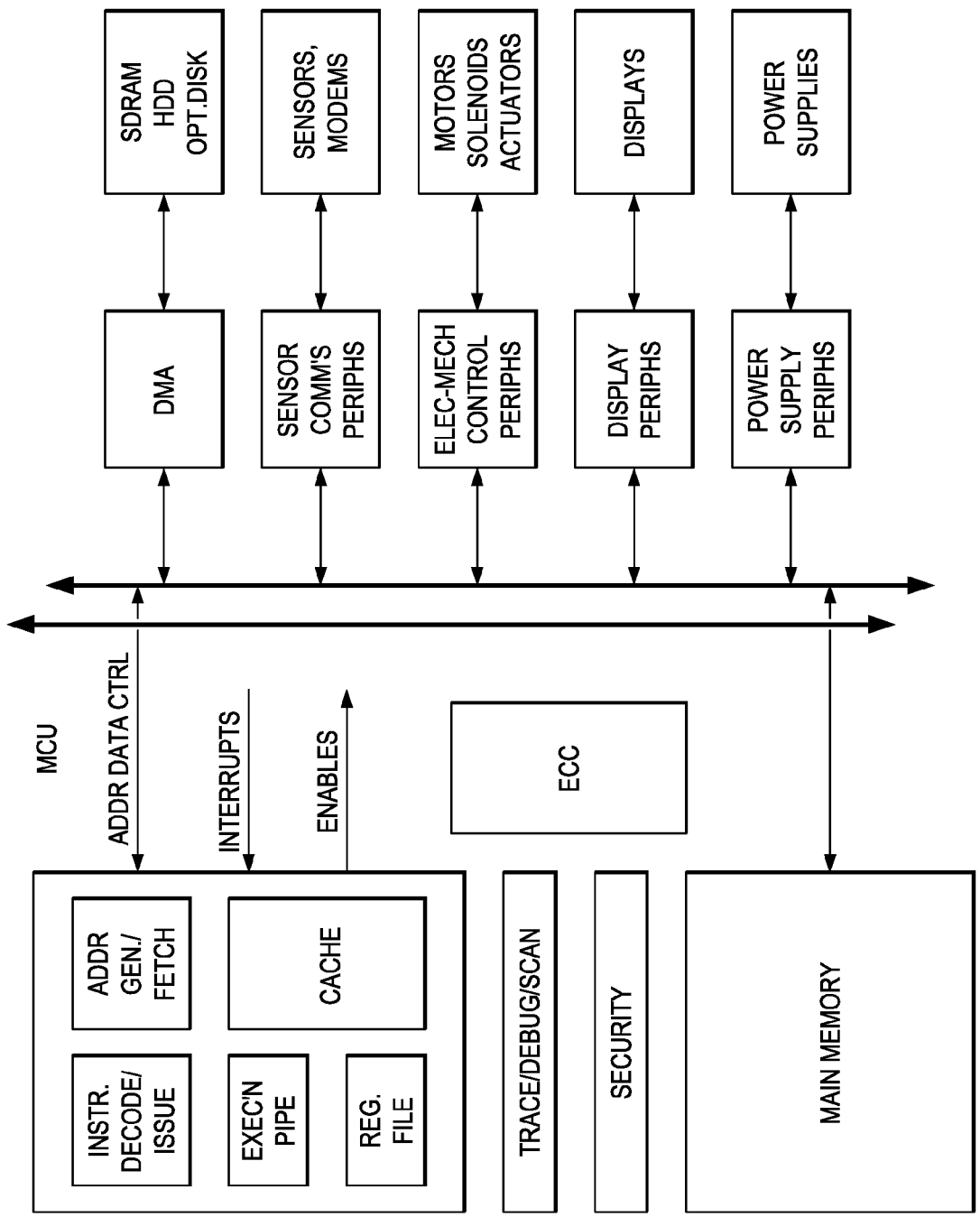
FIG. 24 is a block diagram of inventive computer processing ECC system architecture in automotive, storage, medical and other systems utilizing teachings of this disclosure.

In FIG. 24, an example of a system-on-chip (SoC) includes a processor such as a pipelined microcontroller MCU having a CPU with an address generator and fetch unit, instruction decode and issue unit, pipelined execution unit, register file, and cache memories unit. In various forms, the processor is any of scalar, superscalar, multi-core, or other architecture. One or more buses couple the CPU addresses, data and control lines with a main memory, a DMA (direct memory access) module, and data reception and communications peripherals coupled to or including a data sensor and ADC (analog-to-digital converter) and modems. One or more electro-mechanical control peripherals control motors, actuators, solenoids, displays, and other controlled elements and systems. Display peripherals control, and sense data from, lights, LEDs (light emitting diodes), buttons, touch sensors and other display interfacing. Power supply peripherals control power supply parameters, voltage regulation, power-level switching, smart power management on-chip and off-chip and other powered functions. The control peripherals control and sense automotive engine fuel and mixture, brakes, dashboard, passenger protection, door assemblies, and electrical system voltage regulation, switching and other electrical control. In storage applications, such as for hard drives, optical disk, flash drives, etc., the peripherals are coupled to any one or more of data sensing, programming circuits, electromechanical actuators or heads. In various devices the sensor peripherals can include any one or more of serial-to-parallel converters, UARTs, sigma-delta ADCs, USB interfaces, environmental sensing, medical sensing, camera and other imaging interfaces, wireless modems and other peripherals.

Various embodiments of process and structure are provided in one or more integrated circuit chips, multichip modules (MCMs), device to device (D2D) technology, printed wiring media and printed circuit boards, handsets and larger application boxes, vehicles and platforms.

Aspects (See Explanatory Notes at End of this Section)

1A. The electronic circuit claimed in claim 1 wherein that next address is next with respect to the given address.

1B. The electronic circuit claimed in claim 1 wherein said comparing circuit is responsive to a difference between the given address and a stored address in said address buffer.

1C. The electronic circuit claimed in claim 1 further comprising a parity circuit operable to generate parity bits based on an output from said mixer circuit.

1D. The electronic circuit claimed in claim 1C wherein said parity circuit includes an XOR tree operable to effectuate a matrix multiplication to generate the parity bits.

1E. The electronic circuit claimed in claim 1 further comprising a parity memory fed by said parity circuit to store the parity bits.

1F. The electronic circuit claimed in claim 1 wherein said control circuit is further operable to write an output from said mixer circuit to said memory circuit at the given address.

1G. The electronic circuit claimed in claim 1F wherein a throughput performance of the partial write is increased by locality in data traffic.

1H. The electronic circuit claimed in claim 1 further comprising said accessing circuit wherein said accessing circuit has an access request line coupled to said control circuit.

1J. The electronic circuit claimed in claim 1 wherein a read to said memory circuit consumes more cycles than a read to said data buffer.

13A. The circuit claimed in claim 13 wherein said write buffer includes data for recently write-accessed addresses of said memory.

17A. The circuit claimed in claim 17 further comprising a write address buffer for holding the write address.

20A. The process claimed in claim 21 further comprising speculatively reading data from the memory in the locality of the buffered write data and also buffering the speculatively-read data substantially in the ECC encoder.

21A. The circuit claimed in claim 21 further comprising a control circuit coupled to said encoder, said memory circuit and said parity memory.

21A1. The circuit claimed in claim 21A wherein said control circuit includes a state machine having states at least for Read, Write, and Partial-write.

21A2. The circuit claimed in claim 21A wherein said control circuit is operable to provide controls to said encoder and said memory circuit and provide an address to both said memory circuit and said parity memory.

21A3. The circuit claimed in claim 21A wherein said memory circuit is responsive to memory control and read address signals from said control circuit.

21B. The circuit claimed in claim 21 wherein said encoder includes a write buffer operable to hold write data.

23A. The circuit claimed in claim 23 wherein said decoder includes an XOR block and said decoder is operable to utilize said XOR block as well as said parity bits to correct the data from said memory circuit.

23B. The circuit claimed in claim 23 wherein said decoder has an XOR tree representing a Hsiao-code-based matrix.

23C. The circuit claimed in claim 23 wherein said read-access circuit is selected from the group consisting of 1) direct memory access (DMA), 2) processor, and 3) system module; and said decoder is operable to supply corrected data to said accessing circuit.

25A. The circuit claimed in claim 25 wherein said bus has source parity lines and said mode-responsive selector circuit has a mode wherein source parity enters said error detector via said selector circuit from said source parity lines.

25A1. The circuit claimed in claim 25A wherein said bus also has lines that bypass said selector circuit and enter said error detector.

25B. The circuit claimed in claim 25 wherein said error detector includes an exclusive-OR tree fed both from said bus and from an output of said selector circuit.

25C. The circuit claimed in claim 25 wherein said parity generator module is physically situated in the vicinity of said first place, and said mode-responsive selector circuit and said ECC decoder are physically situated in the vicinity of said second place.

25D. The circuit claimed in claim 25 wherein said bus includes data lines and parity data lines, and said mode-responsive selector circuit and said error detector are together selectively operable to conduct a first test of said data lines and parity data lines with said parity generator deselected, and perform a second test of at least said data lines with said parity generator selected.

25D1. The circuit claimed in claim 25D wherein said mode-responsive selector circuit and said error detector are together selectively operable to conduct a third test of said parity data lines with said parity generator alternately selected and deselected.

25E. The circuit claimed in claim 25 wherein said bus is subject to crosstalk errors.

32A. The automotive electronics system claimed in claim 32 wherein said ECC circuit further includes a parity memory wherein said parity generator has a pipelined write to said parity memory.

32A1. The automotive electronics system claimed in claim 32A wherein said microcontroller includes a read access circuit that is operable to cause a read to said parity memory regardless of whether the read is simultaneous with the actual occurrence of the pipelined write to said parity memory whereby said read-access circuit is pipeline-unaware.

32A2. The automotive electronics system claimed in claim 32 wherein said parity memory is dual-ported so that said parity memory is operable to read out parity bits for data that is read from said first-named memory while said parity generator is concurrently operable to write other parity bits to said parity memory by said pipelined write.

36A. The computer processing system claimed in claim 36 further comprising a DMA (direct memory access) module coupled to said bus.

36B. The computer processing system claimed in claim 36 further comprising a multichip module (MCM) individually carrying integrated circuits for at least two of the above-recited elements respectively.

36C. The computer processing system claimed in claim 36 further comprising a printed circuit board to which at least part of said bus is affixed, and holding integrated circuits for at least two of the above-recited elements respectively.

36D. The computer processing system claimed in claim 36 further comprising a high-volume storage apparatus coupled to said data sensor peripheral.

36E. The computer processing system claimed in claim 36 further comprising a physical support structure to which at least part of said bus is affixed, and holding integrated circuits for at least two of the above-recited elements respectively.

36F. The computer processing system claimed in claim 36 further comprising a medical sensor coupled to said data sensor peripheral.

36F1. The computer processing system claimed in claim 36F wherein said modem is operable to send data obtained from said medical sensor for remote analysis.

37A. The manufacturing process claimed in claim 37 wherein said error report includes a running count of errors.

37B. The manufacturing process claimed in claim 37 wherein the error report includes an error log of addresses associated with errors.

37C. The manufacturing process claimed in claim 37 wherein the updating also includes updating a parity error log of addresses associated with discrepant comparisons.

A40. A manufacturing process comprising: fabricating an integrated circuit memory with an ECC circuit and parity memory; enabling the ECC circuit; writing a pre-established data pattern into the memory; generating parity for the data pattern by the ECC circuit and writing the parity into the parity memory; operating the ECC circuit to read from the memory and decode the read data using parity from the parity memory to form a first decoded result; disabling the ECC circuit; rewriting the memory with at least one bit wrong at one or more memory locations for the data pattern, while leaving the parity in the parity memory unaffected; enabling the ECC circuit; operating the ECC circuit to again read from the memory and decode the read data using parity from the parity memory to form a second decoded result; comparing the first and second decoded results; and updating an error report with the results of the comparing.

A40A. The manufacturing process claimed in claim 39 wherein said updating also includes providing a first count of errors represented by the first decoded result.

A40B. The manufacturing process claimed in claim A40 wherein said updating also includes providing a second count of errors represented by the second decoded result.

A40C. The manufacturing process claimed in claim A40 wherein said updating also includes providing an error log of errors and corresponding memory addresses.

A40D. The manufacturing process claimed in claim A40 wherein said updating also includes providing an error log of the comparisons and corresponding memory addresses.

A40E. The manufacturing process claimed in claim A40 wherein disabling the ECC circuit bypasses an ECC encode.

A40F. The manufacturing process claimed in claim A40 further comprising entering modes into a memory mapped register to enable and disable that ECC circuit.

A40G. The manufacturing process claimed in claim A40 wherein said updating also includes updating a running count of instances of multiple errors in a given datum.

A40H. The manufacturing process claimed in claim A40 further comprising generating an interrupt upon an instance of a multiple error in a given datum.

A40H1. The manufacturing process claimed in claim A40H further comprising updating a running count of instances of such multiple errors, servicing the interrupt and decrementing the running count when an interrupt is serviced.

A40J. The manufacturing process claimed in claim A40 further comprising determining whether an error is correctable, and if so correcting the error.

A41. A manufacturing process comprising: fabricating an integrated circuit memory with a bus coupled to an ECC circuit; testing for memory errors and correcting the memory errors; and testing for bus errors independently and then correcting the bus errors.

Notes: Aspects are description paragraphs that might be offered as claims in patent prosecution. The above dependently-written Aspects have leading digits and may have internal dependency designations to indicate the claims or aspects to which they pertain. The leading digits and alphanumerics indicate the position in the ordering of claims at which they might be situated if offered as claims in prosecution.

A few preferred embodiments have been described in detail hereinabove. It is to be understood that the scope of the invention comprehends embodiments different from those described, as well as described embodiments, yet within the inventive scope. Microprocessor and microcomputer are synonymous herein. Processing circuitry comprehends digital, analog and mixed signal (digital/analog) integrated circuits, ASIC circuits, PALs, PLAs, decoders, memories, non-software based processors, microcontrollers and other circuitry, and digital computers including microprocessors and microcomputers of any architecture, or combinations thereof. Internal and external couplings and connections can be ohmic, capacitive, inductive, photonic, and direct or indirect via intervening circuits or otherwise as desirable. Implementation is contemplated in discrete components or fully integrated circuits in any materials family and combinations thereof. Various embodiments of the invention employ hardware, software or firmware. Process diagrams and block diagrams herein are representative of flows and/or structures for operations of any embodiments whether of hardware, software, or firmware, and processes of manufacture thereof.

While this invention has been described with reference to illustrative embodiments, this description is not to be construed in a limiting sense. Various modifications and combinations of the illustrative embodiments, as well as other embodiments of the invention may be made. The terms "including", "includes", "having", "has", "with", or variants thereof are used in the detailed description and/or the claims to denote non-exhaustive inclusion in a manner similar to the term "comprising". It is therefore contemplated that the appended claims and their equivalents cover any such embodiments, modifications, and embodiments as fall within the true scope of the invention.

What is claimed is:

1. An electronic circuit comprising:
a memory accessible by a memory read;
a parity memory;
a bus connected to said memory and said parity memory;
an accessing circuit coupled to said memory via said bus to obtain data by a memory read;
an error correcting code encoder coupled to said bus and said encoder including a write buffer operable to hold write data and having a pipelined write to said parity memory;
an error correcting code decoder coupled to said memory; and
a read-access circuit that is operable to cause a read to said parity memory regardless of whether the read is simultaneous with the occurrence of the pipelined write to said parity memory whereby said read-access circuit is pipeline-unaware;
wherein said parity memory is dual-ported so that, on a read caused by said pipeline-unaware read-access circuit, said parity memory is operable to read out parity bits for data that is read from said memory and said encoder is concurrently operable to write other parity bits to said parity memory by said pipelined write.

2. The circuit claimed in claim 1 wherein a read bypass circuit is coupled to obtain the data for said accessing circuit from said write buffer when said write buffer already includes the data that is to be obtained by the memory read and said read bypass circuit is operable to prevent the memory read when said write buffer already includes write data that is to be obtained by such memory read.

3. The circuit claimed in claim 2 wherein said read bypass circuit is coupled between said encoder and said decoder.

4. The circuit claimed in claim 1 wherein said decoder includes a syndrome generator operable to generate a syndrome that may indicate no error, and said decoder further includes an error correction circuit fed by said syndrome generator, said read bypass circuit further operable to bypass the error correction circuit with respect to the memory read when said syndrome generator indicates no error.

5. The circuit claimed in claim 1 wherein the read bypass circuit includes a multiplexer circuit operable to select a first input based on the memory read or a second input based on said write buffer depending on whether said write buffer already includes the data that is to be obtained by such memory read.

6. The circuit claimed in claim 1 wherein the memory read includes a read address, and further comprising an address comparing circuit coupled to signal said read bypass circuit so that if the read address matches a write address for data in said write buffer, then the data for said accessing circuit comes from said write buffer, instead of from said memory.

7. The circuit claimed in claim 6 further comprising a write address buffer for holding the write address.

8. The circuit claimed in claim 1 wherein said decoder includes a syndrome generator and an error correction circuit fed by said syndrome generator, and said read bypass circuit is operable to bypass said memory, said syndrome generator and said error correction circuit.

9. The circuit claimed in claim 1 wherein said dual-ported parity memory is operable, upon concurrent read and write accesses to a same address therein, to read out existing parity bits from that address and to write the other parity bits to that address in said parity memory.

10. The circuit claimed in claim 1 further comprising an error correcting code decoder coupled to said memory and to said read-access circuit, and said error correcting code decoder operable to process data read from said memory as well as parity bits read from said dual-ported parity memory.

11. The circuit claimed in claim 1 wherein said read-access circuit includes a CPU that is pipeline-unaware of the pipelined write to said parity memory, whereby said dual-ported parity memory is operable to improve throughput for pipelined error correcting code operations.

12. The circuit claimed in claim 1 further comprising:
a parity generator module coupled to a first place on said bus and operable to generate ECC parity; and
a mode-responsive selector circuit fed at a first input from said parity generator module and at a second input from a second place on said bus.

13. The circuit claimed in claim 12, wherein said bus includes at least one pipeline register situated intermediately along said bus between said first place and said second place.

14. The circuit claimed in claim 12, further comprising parity lines between said parity generator and the first input of said selector circuit, said parity lines including a respective parity pipeline register corresponding to each said pipeline register situated intermediately along said bus.

15. The circuit claimed in claim 12, wherein said bus has data lines and further comprising a source of data for said data lines wherein said source is operable to send data on a plurality of said data lines and parity on at least two other ones of said data lines and further operable instead to send data on all of said data lines.

* * * * *